(12) United States Patent
Lin et al.

(10) Patent No.: US 11,855,030 B2
(45) Date of Patent: Dec. 26, 2023

(54) PACKAGE STRUCTURE AND METHOD OF MANUFACTURING THE SAME

(71) Applicant: Taiwan Semiconductor Manufacturing Company, Ltd., Hsinchu (TW)

(72) Inventors: Tsung-Shu Lin, New Taipei (TW); Hsuan-Ning Shih, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 10 days.

(21) Appl. No.: 17/378,798

(22) Filed: Jul. 19, 2021

(65) Prior Publication Data

US 2021/0343675 A1    Nov. 4, 2021

Related U.S. Application Data

(63) Continuation of application No. 16/409,880, filed on May 13, 2019, now Pat. No. 11,069,642.

(Continued)

(51) Int. Cl.
*H01L 21/56* (2006.01)
*H01L 23/538* (2006.01)
(Continued)

(52) U.S. Cl.
CPC .......... *H01L 24/25* (2013.01); *H01L 21/4853* (2013.01); *H01L 21/568* (2013.01); *H01L 23/49816* (2013.01); *H01L 23/5389* (2013.01); *H01L 24/13* (2013.01); *H01L 24/24* (2013.01); *H01L 24/73* (2013.01); *H01L 24/82* (2013.01); *H01L 24/92* (2013.01); *H01L 2224/13022* (2013.01); *H01L 2224/24137* (2013.01); *H01L 2224/24227* (2013.01); *H01L 2224/2501* (2013.01); *H01L 2224/25171* (2013.01); *H01L 2224/73209* (2013.01);

(Continued)

(58) Field of Classification Search
CPC ... H01L 24/25; H01L 21/4853; H01L 21/568; H01L 23/5389; H01L 24/13; H01L 24/82; H01L 2224/821
See application file for complete search history.

(56) References Cited

U.S. PATENT DOCUMENTS 8,987,922 B2    3/2015 Yu et al.
9,000,584 B2    4/2015 Lin et al.
(Continued)

*Primary Examiner* — Thanh Y. Tran
(74) *Attorney, Agent, or Firm* — JCIPRNET

(57) ABSTRACT

A package structure includes a semiconductor die, a redistribution circuit structure, and conductive pads. The redistribution circuit structure is located on and electrically connected to the semiconductor die, the redistribution circuit structure includes a first contact pad having a first width and a second contact pad having a second width. The conductive pads are located on and electrically connected to the redistribution circuit structure through connecting to the first contact pad and the second contact pad, the redistribution circuit structure is located between the conductive pads and the semiconductor die. The first width of the first contact pad is less than a width of the conductive pads, and the second width of the second contact pad is substantially equal to or greater than the width of the conductive pads.

20 Claims, 15 Drawing Sheets

Related U.S. Application Data

(60) Provisional application No. 62/784,680, filed on Dec. 24, 2018.

(51) Int. Cl.
*H01L 23/00* (2006.01)
*H01L 23/498* (2006.01)
*H01L 21/48* (2006.01)

(52) U.S. Cl.
CPC ............ *H01L 2224/73267* (2013.01); *H01L 2224/821* (2013.01); *H01L 2224/82005* (2013.01); *H01L 2224/92244* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,511 B2 | 2/2016 | Yu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0301389 A1* | 10/2018 | Liu ................... H01L 25/105 |
| 2019/0157206 A1* | 5/2019 | Wang ............. H01L 23/49816 |
| 2019/0385989 A1* | 12/2019 | Yu ..................... H01L 23/5386 |
| 2019/0393149 A1* | 12/2019 | Wang .................... H01L 24/17 |
| 2020/0020657 A1* | 1/2020 | Lai ..................... H01L 23/3128 |
| 2020/0058626 A1* | 2/2020 | Tai ...................... H01L 21/568 |

\* cited by examiner

US 11,855,030 B2

PACKAGE STRUCTURE AND METHOD OF MANUFACTURING THE SAME

CROSS-REFERENCE TO RELATED APPLICATION

This application is a continuation application of and claims the priority benefit of a prior application Ser. No. 16/409,880, filed on May 13, 2019 and now allowed, which claims the priority benefit of U.S. provisional application Ser. No. 62/784,680, filed on Dec. 24, 2018. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. In addition, such packages may further be integrated to a semiconductor substrate or carrier after dicing. Therefore, the reliability of the electrical connection between conductive terminals and an internal component (e.g. a redistribution circuit structure) within each package becomes important.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
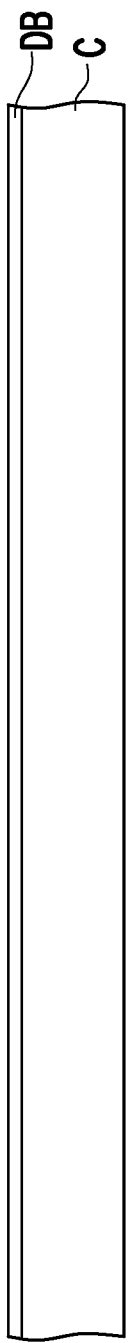
FIG. 1 to FIG. 8 are schematic cross sectional views of various stages in a manufacturing method of a package structure in accordance with some embodiments of the present disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 10:
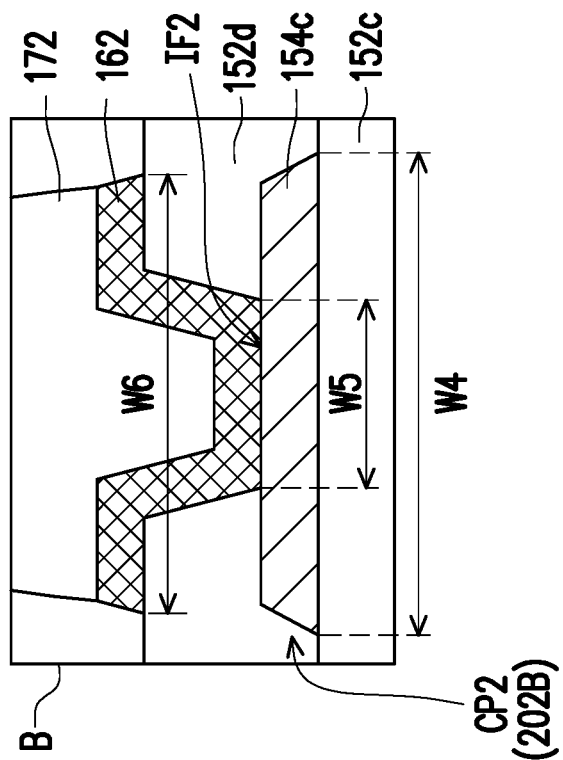
FIG. 10 is an enlarged, schematic cross sectional view of a portion of the package structure depicted in FIG. 8.
Figure 12:
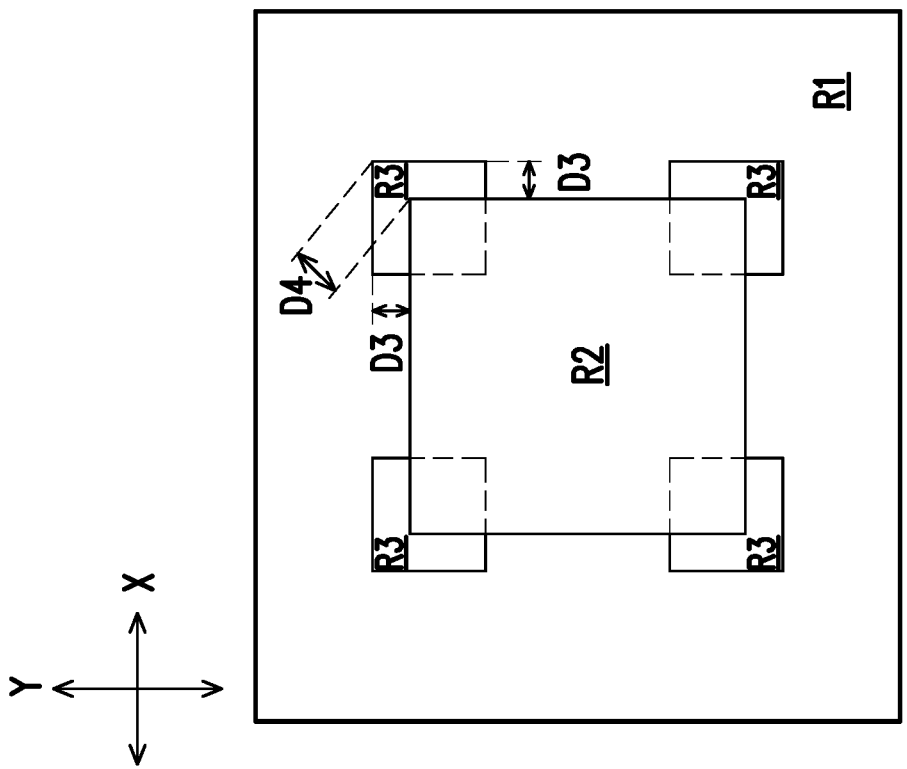
FIG. 12 is a top view illustrating a relative position between a connection pad and a semiconductor die in accordance with some embodiments of the disclosure.
Figure 11:
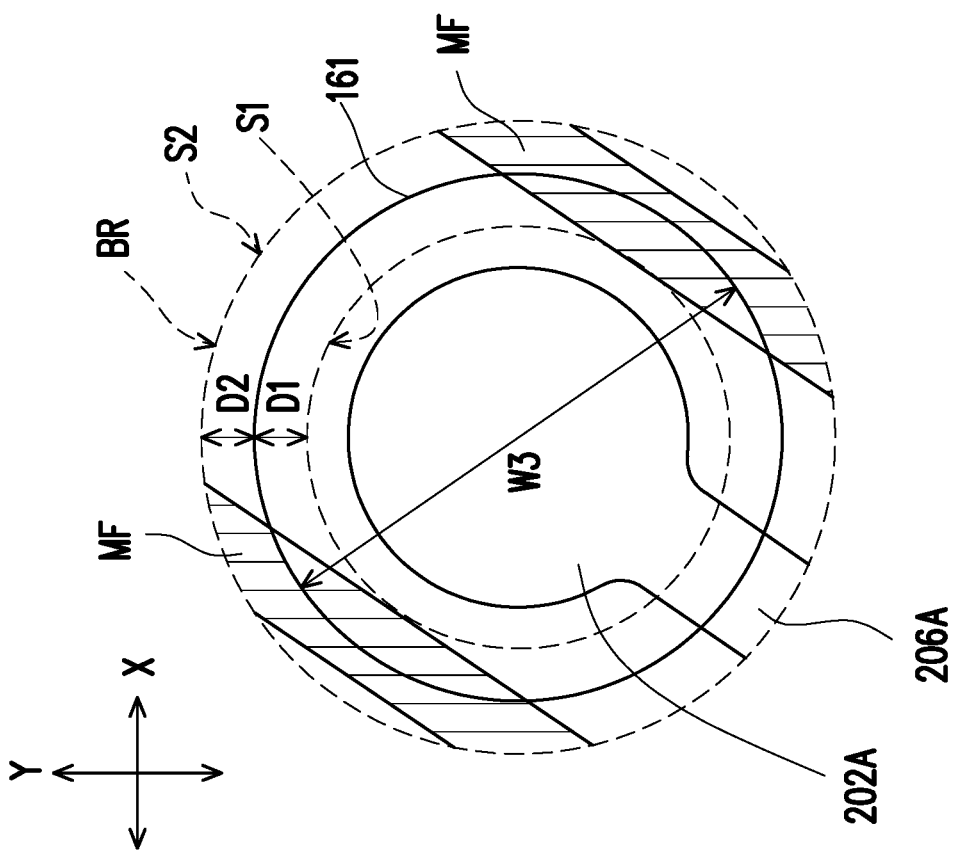
FIG. 11 is an enlarged, schematic top view of a portion of the package structure depicted in FIG. 8.

FIG. 1 to FIG. 8 are schematic cross sectional views of various stages in a manufacturing method of a package structure in accordance with some embodiments of the present disclosure. FIG. 9 is an enlarged, schematic cross sectional view of a portion of the package structure depicted in FIG. 8, where the portion of the package structure is indicated by a dotted box A shown in FIG. 8. FIG. 10 is an enlarged, schematic cross sectional view of a portion of the package structure depicted in FIG. 8, where the portion of the package structure is indicated by a dotted box B shown in FIG. 8. FIG. 11 is an enlarged, schematic top view of a portion of the package structure depicted in FIG. 8. FIG. 12 is a top view illustrating a relative position between a connection pad and a semiconductor die in accordance with some embodiments of the disclosure. In embodiments, the manufacturing method is part of a wafer level packaging process. It is to be noted that the process steps described herein cover a portion of the manufacturing processes used to fabricate a package structure.

The embodiments are intended to provide further explanations but are not used to limit the scope of the present disclosure. In FIG. 1 to FIG. 8, more than one (semiconductor) chips or dies are shown to represent plural (semiconductor) chips or dies of the wafer, and one (semiconductor) package structure is shown to represent plural (semiconductor) package structures obtained following the (semiconductor) manufacturing method, however the disclosure is not limited thereto. In other embodiments, one or more than one (semiconductor) chips or dies are shown to represent plural (semiconductor) chips or dies of the wafer, and one or more than one (semiconductor) package structure are shown to represent plural (semiconductor) package structures obtained following the (semiconductor) manufacturing method, however the disclosure is not limited thereto.

Referring to FIG. 1, in some embodiments, a carrier C is provided. In some embodiments, the carrier C may be a glass carrier or any suitable carrier for carrying a semiconductor wafer or a reconstituted wafer for the manufacturing method of the semiconductor package. In some embodiments, the carrier C is coated with a debond layer DB (as shown in FIG. 1). The material of the debond layer DB may be any material suitable for bonding and debonding the carrier C from the above layer(s) or any wafer(s) disposed thereon.

In some embodiments, the debond layer DB may include a dielectric layer made of a dielectric material including any suitable polymer-based dielectric material (such as benzocyclobutene (BCB), polybenzoxazole (PBO)). In an alternative embodiment, the debond layer DB may include a dielectric material layer made of an epoxy-based thermal-release material, which loses its adhesive property when heated, such as a light-to-heat-conversion (LTHC) release coating film. In a further alternative embodiment, the debond layer DB may include a dielectric material layer made of an ultra-violet (UV) glue, which loses its adhesive property when exposed to UV lights. In certain embodiments, the debond layer DB may be dispensed as a liquid and cured, or may be a laminate film laminated onto the carrier C, or may be the like. The top surface of the debond layer DB, which is opposite to a bottom surface contacting the carrier C, may be levelled and may have a high degree of coplanarity. In certain embodiments, the debond layer DB is, for example, a LTHC layer with good chemical resistance, and such layer enables room temperature debonding from the carrier C by applying laser irradiation, however the disclosure is not limited thereto.

In some embodiments, a buffer layer (not shown) is coated on the debond layer DB, where the debond layer DB is sandwiched between the buffer layer and the carrier C, and the top surface of the buffer layer may provide a high degree of coplanarity. In some embodiments, the buffer layer may be formed by depositing a dielectric material layer atop the debond layer DB. In some embodiments, the buffer layer 112 may be formed by spin coating a polymeric material on the debond layer DB. For example, the buffer layer may be a polymer layer which made of polyimide (PI), low temperature polyimide (LTPI), PBO, BCB, or any other suitable polymer-based dielectric material. In some embodiments, the buffer layer may be formed by laminating an Ajinomoto buildup film (ABF), a solder resist film (SR), or the like on the debond layer DB. The disclosure is not limited thereto. In an alternative embodiment, the buffer layer is optional and may be omitted based on the demand and the design layout.

Figure 2:
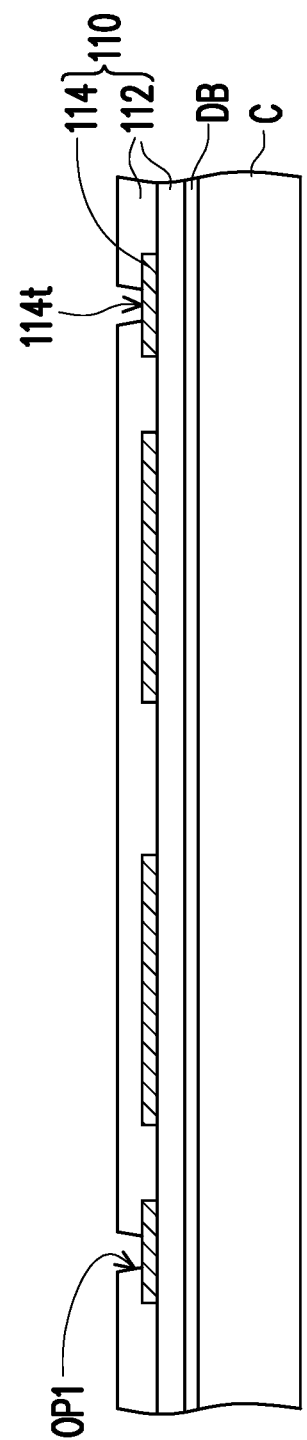

Referring to FIG. 2, in some embodiments, a redistribution circuit structure 110 is formed on the debond layer DB and over the carrier C. For example, in FIG. 2, the redistribution circuit structure 110 is formed on the debond layer DB, and the formation of the redistribution circuit structure 110 includes sequentially forming one or more dielectric layers 112 and one or more metallization layers 114 in alternation. In some embodiments, the redistribution circuit structure 110 includes two dielectric layers 112 and one metallization layer 114 as shown in FIG. 2, where the metallization layer 114 is sandwiched between the dielectric layers 112, and portions of a top surface 114t of the metallization layer 114 are respectively exposed by openings OP1 formed in a topmost layer of the dielectric layers 112. However, the disclosure is not limited thereto. The number of the metallization layer and the number of the dielectric layer included in the redistribution circuit structure 110 are not limited thereto, and may be designated and selected based on the demand. For example, the number of the metallization layer and the number of the dielectric layer may be one or more than one.

In certain embodiments, the material of the dielectric layers 112 may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 112 formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 114 may be made of conductive materials formed by electroplating or deposition, such as aluminum, titanium, copper, nickel, tungsten, and/or alloys thereof, which may be patterned using a photolithography and etching process. In some embodiments, the metallization layer 114 may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 3:
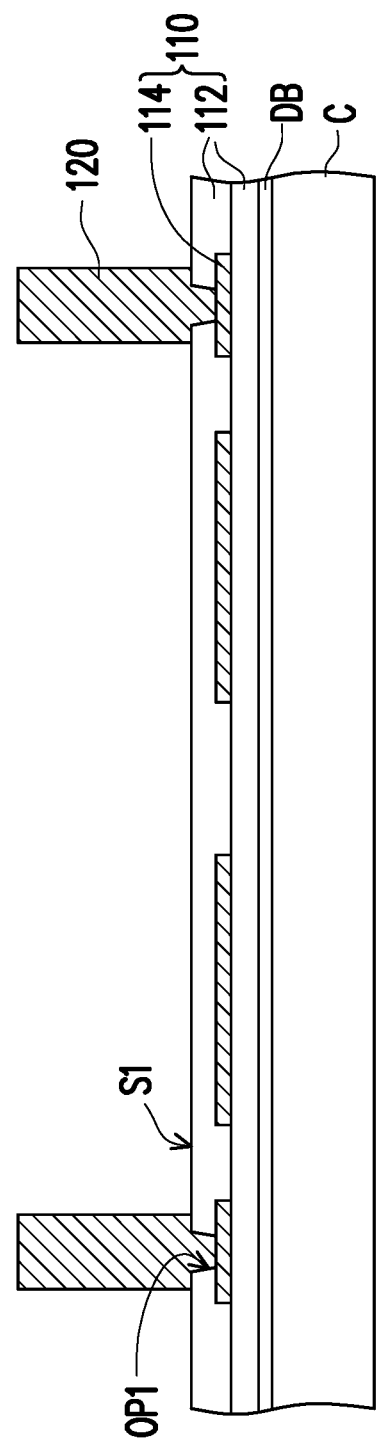

Referring to FIG. 3, in some embodiments, a plurality of conductive pillars 120 are formed on the redistribution circuit structure 110 (e.g. a first side S1 of the redistribution circuit structure 110). In some embodiments, the conductive pillars 120 may be through integrated fan-out (InFO) vias. In some embodiments, the conductive pillars 120 are arranged along but not on a cutting line (not shown) between two package structures 10. For simplification, only two conductive pillars 120 are presented in FIG. 3 for illustrative purposes, however it should be noted that more than two conductive pillars may be formed; the disclosure is not limited thereto. The number of the conductive pillars 120 may be designated and selected based on the demand, and adjusted by changing the number of the openings OP1. As shown in FIG. 3, the conductive pillars 120 are physically connected to the metallization layer 114 of the redistribution circuit structure 110, so that the conductive pillars 120 are electrically connected to the redistribution circuit structure 110.

In some embodiments, the conductive pillars 120 are formed by photolithography, plating, photoresist stripping processes or any other suitable method. For example, the plating process may include an electroplating plating, an electroless plating, or the like. For example, the conductive pillars 120 may be formed by forming a mask pattern (not shown) covering the redistribution circuit structure 110 with openings exposing the top surface 114t of the metallization layer 114 exposed by the openings OP1 formed in the topmost layer of the dielectric layers 112, forming a metallic material filling the openings formed in the mask pattern and the openings OP1 to form the conductive pillars 120 by electroplating or deposition and then removing the mask pattern. In one embodiment, the mask pattern may be removed by acceptable ashing process and/or photoresist stripping process, such as using an oxygen plasma or the like. In one embodiment, prior to the formation of the mask pattern, a seed layer may be formed conformally over the redistribution circuit structure 110. The disclosure is not limited thereto. In some embodiments, the material of the conductive pillars 120 may include a metal material such as copper or copper alloys, or the like. However, the disclosure is not limited thereto.

In alternative embodiments, the conductive pillars 120 may be pre-fabricated conductive pillars which may be disposed on the redistribution circuit structure 110 by picking- and placing.

Figure 4:
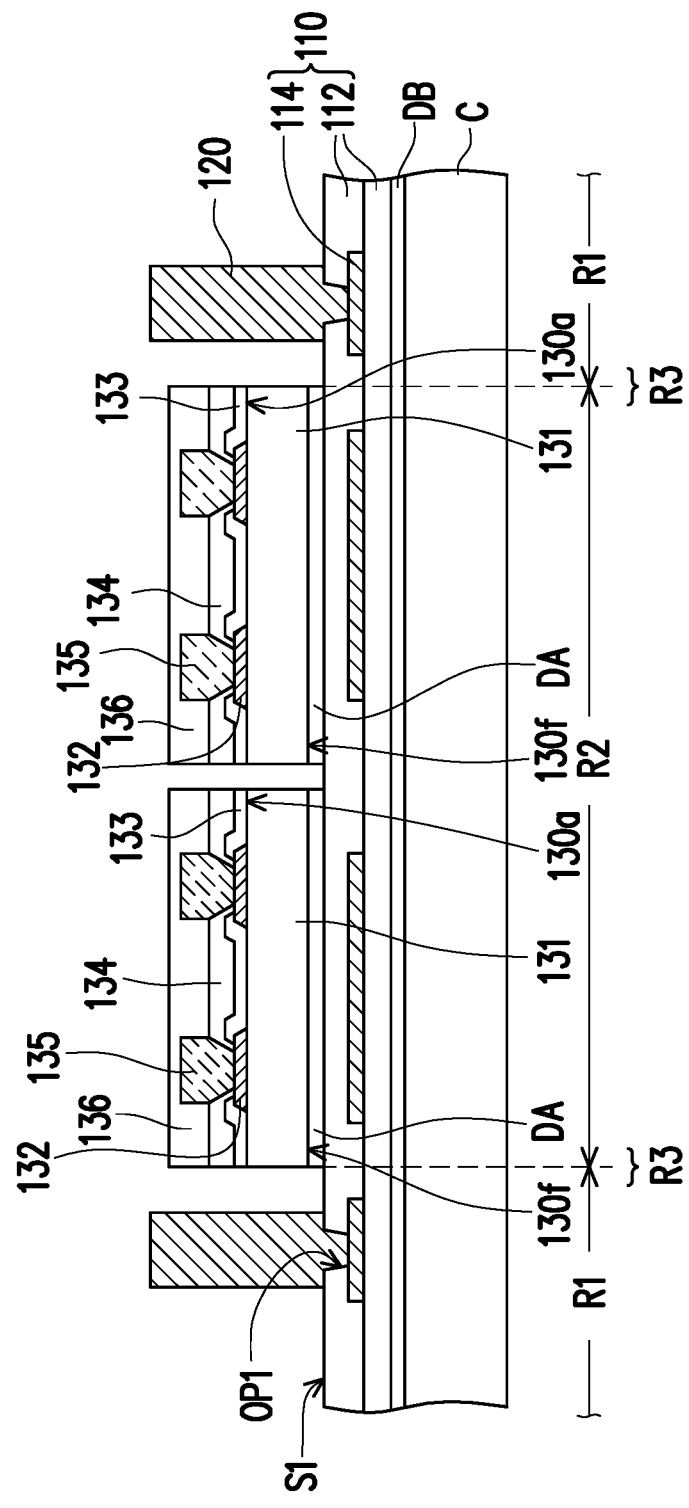

Referring to FIG. 4, in some embodiments, at least one semiconductor die 130 with a connecting film DA disposed thereon is provided. Hereafter, two semiconductor dies 130 are shown in FIG. 4 for illustration purpose; the disclosure is not limited thereto. In other embodiments, the number of the semiconductor dies 130 may be one or more than one based on the demand and the design layout.

In some embodiments, the semiconductor dies 130 each include a substrate 131 having an active surface 131a and a backside surface 131b opposite to the active surface 131a, a plurality of conductive pads 132 formed on the active surface 131a, a passivation layer 133 disposed on and partially exposing the conductive pads 132, a post-passivation layer 134 disposed on the passivation layer 133 and partially exposing the conductive pads 132, connecting vias 135 disposed on the conductive pads 132, and a protection layer 136 covering the post-passivation layer 134 and the connecting vias 135. In other words, the conductive pads 132 distributed on the active surface 131a of the substrate 131 are partially exposed by contact openings of the passivation layer 133 and contact openings of the post-passivation layer 134, so as to physically connect to the connecting vias 135.

For example, the substrate 131 is a semiconductor substrate. In some embodiments, the material of the substrate 131 may include a silicon substrate including active components (e.g., transistors and/or memories such as NMOS and/or PMOS devices, or the like) and/or passive components (e.g., resistors, capacitors, inductors or the like) formed therein. In an alternative embodiment, the substrate 131 may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. The disclosure is not limited thereto.

In some embodiments, the conductive pads 132 may be aluminum pads or other suitable metal pads. For example, the forming process of the conductive pads 132 may be substantially the same or similar to the formation of the metallization layer 114.

In some embodiments, the connecting vias 135 may be copper pillars, copper alloy pillar or other suitable metal pillars. For example, the forming process of the connecting vias 135 may be substantially the same or similar to the formation of the conductive pillars 120. However, the disclosure is not limited thereto.

In some embodiments, the passivation layer 133, the post-passivation layer 134 and/or the protection layer 136 may be a PBO layer, a PI layer or other suitable polymers. In certain embodiments, the passivation layer 133, the post-passivation layer 134 and/or the protection layer 136 may be made of inorganic materials, such as silicon oxide, silicon nitride, silicon oxynitride, or any suitable dielectric material. In one embodiment, the materials of the passivation layer 133, the post-passivation layer 134 and/or the protection layer 136 may be the same. In an alternative embodiment, the materials of the passivation layer 133, the post-passivation layer 134 and/or the protection layer 136 may be different from one another, the disclosure is not limited thereto.

In some embodiments, each of the semiconductor dies 130 described herein may be referred to as a chip or an integrated circuit (IC). In some embodiments, the semiconductor dies 130 may include chip(s) of the same type or different types. For example, the semiconductor dies 130 include wireless and radio frequency (RF) chips. For example, in an alternative embodiment, the semiconductor dies 130 digital chips, analog chips, or mixed signal chips, such as application-specific integrated circuit ("ASIC") chips, sensor chips, wireless and radio frequency (RF) chips, memory chips, logic chips, voltage regulator chips, or a combination thereof. In an alternative embodiment, semiconductor dies 130, one or all, may be referred to as a chip or a IC of combination-type. For example, at least one of the semiconductor dies 130 may be a WiFi chip simultaneously including both of a RF chip and a digital chip. The disclosure is not limited thereto.

Continued on FIG. 4, in some embodiments, the semiconductor dies 130 are disposed on the redistribution circuit structure 110 and over the carrier C through the connecting films DA, respectively. As shown in FIG. 4, for example, the semiconductor dies 130 are picked-up and placed on the redistribution circuit structure 110 along a stacking direction (e.g. a direction Z), and are attached or adhered on the redistribution circuit structure 100 through the connecting films DA, respectively. In some embodiments, the connecting films DA are located between the semiconductor dies 130 and the redistribution circuit structure 110, and the connecting films DA physically contact the backside surfaces 130f of the semiconductor dies 130 and the redistribution circuit structure 110 (e.g. the top surface S1 of the redistribution circuit structure 110). In some embodiments, due to the connecting films DA provided between the semiconductor dies 130 and the redistribution circuit structure 110, the semiconductor dies 130 and the redistribution circuit structure 110 are stably adhered to each other. In some embodiments, the connecting films DA may be, for example, a die attach film, a layer made of adhesives or epoxy resin, or the like. In some embodiments, the redistribution circuit structure 110 is referred to as a back-side redistribution layer of the semiconductor dies 130 for providing routing function.

As shown in FIG. 4, for example, a positioning location (e.g. a region R1 as shown in FIG. 4) of the conductive pillars 120 are located aside of a positioning location (e.g. a region R2 as shown in FIG. 4) of the semiconductor dies 130 on a X-Y plane (where a direction X is different from a direction Y, and the directions X and Y are different form the direction Z (e.g. the stacking direction)). For example, the region R2 is surrounded by the region R1 as depicted in FIG. 12. As shown in FIG. 12, one region R2 (with multiple semiconductor dies 130 disposed therein) is shown for illustration purpose, however the disclosure is not limited thereto. In an alternative embodiment, one or more than one region R2 may be included and surrounded by the region R1 in package structure 10, where each region R2 may include one or more than one semiconductor die 130.

In some embodiments, in FIG. 4, a height of the conductive pillars 120 is greater than a height of the semiconductor dies 130; however, the disclosure is not limited thereto. In an alternative embodiment, the height of the conductive pillars 120 may be less than or substantially equal to the height of the semiconductor dies 130.

In one embodiment, the conductive pillars 120 may be formed prior to the formation of the semiconductor dies 130, as shown in FIG. 3 and FIG. 4; however, the disclosure is not limited thereto. In an alternative embodiment, the conductive pillars 120 may be formed after the formation of the semiconductor dies 130.

Figure 5:
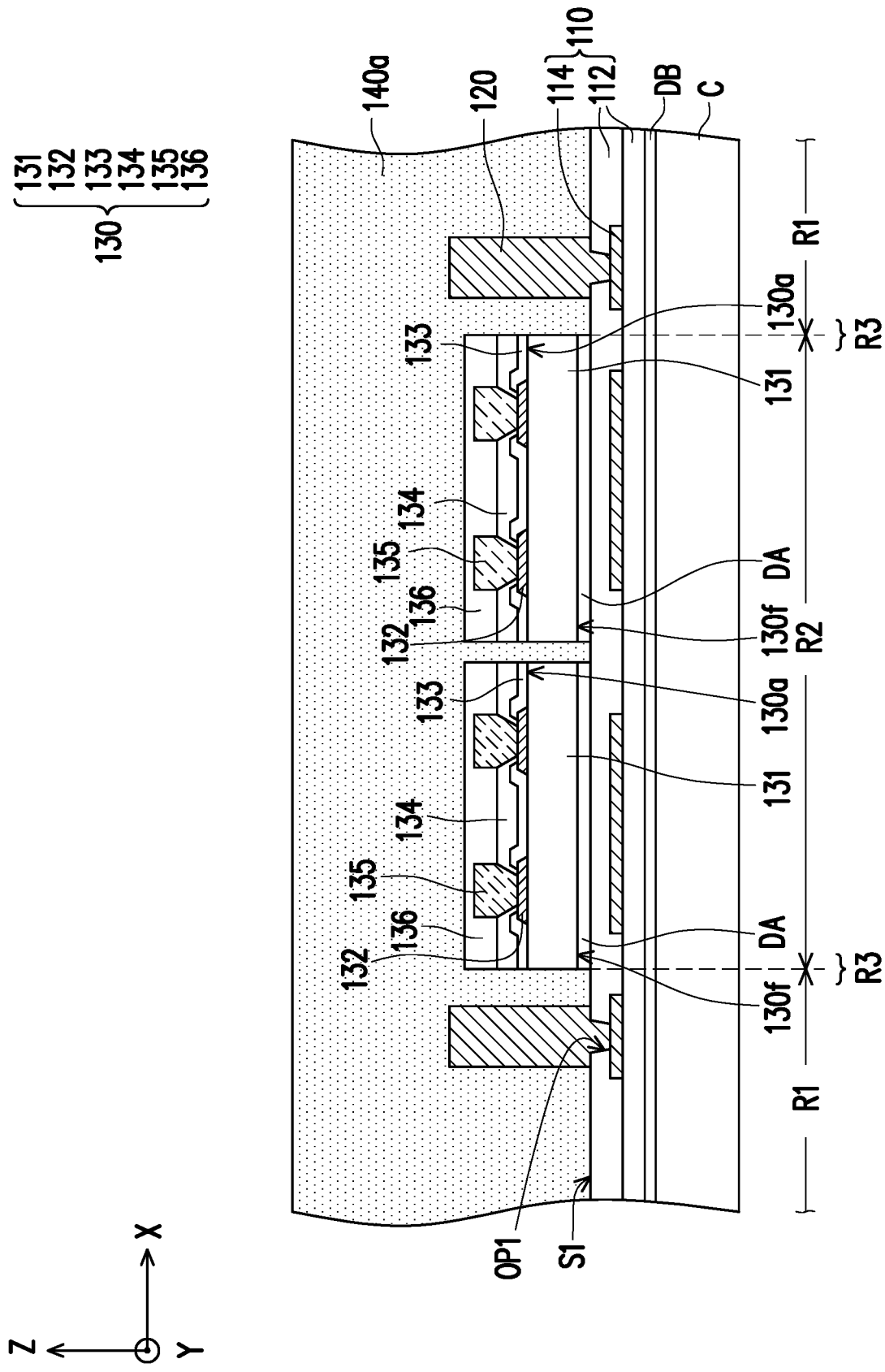

Referring to FIG. 5, in some embodiments, an insulating encapsulation 140a is formed over the carrier C (e.g., on the redistribution circuit structure 110) to encapsulate the conductive pillars 120 and the semiconductor dies 130. In other words, the insulating encapsulation 140a is formed on the redistribution circuit structure 110 and over the carrier C, where the conductive pillars 120 and the semiconductor dies 130 are covered by and embedded in the insulating encapsulation 140a. As shown in FIG. 5, for example, the insulating encapsulation 140a at least fills up the gaps between the conductive pillars 120 and between the conductive pillars 120, the semiconductor dies 130 and the connecting films DA, where sidewalls 120s of the conductive pillars 120 and sidewalls 130s of the semiconductor dies 130 are covered by the insulating encapsulation 140a. In some embodiments, the top surface S1 of the redistribution circuit structure 110 exposed by the conductive pillars 120 and the semiconductor dies 130 (along with the connecting films DA) are covered by the insulating encapsulation 140a. For example, as shown in FIG. 5, the redistribution circuit structure 110, the conductive pillars 120 and the semiconductor dies 130 are not accessibly revealed by the insulating encapsulation 140a.

In the disclosure, a coefficient of thermal expansion (CTE) of the insulating encapsulation 140a is less than a coefficient of thermal expansion of the semiconductor dies 130. For example, the CTE of the insulating encapsulation 140a is ranging from about 6 to about 16. In some embodiments, the insulating encapsulation 140a is a molding compound formed by a molding process. In some embodiments, the insulating encapsulation 140a, for example, may include polymers (such as epoxy resins, phenolic resins, silicon-containing resins, or other suitable resins), dielectric materials having low permittivity and low loss tangent properties, or other suitable materials. The disclosure is not limited thereto. In an alternative embodiment, the insulating encapsulation 140a may include an acceptable insulating encapsulation material. In some embodiments, the insulating encapsulation 140a may further include inorganic filler or inorganic compound (e.g. silica, clay, and so on) which can be added therein to optimize the CTE of the insulating encapsulation 140a to be within the range of about 6 to about 16.

Figure 6:
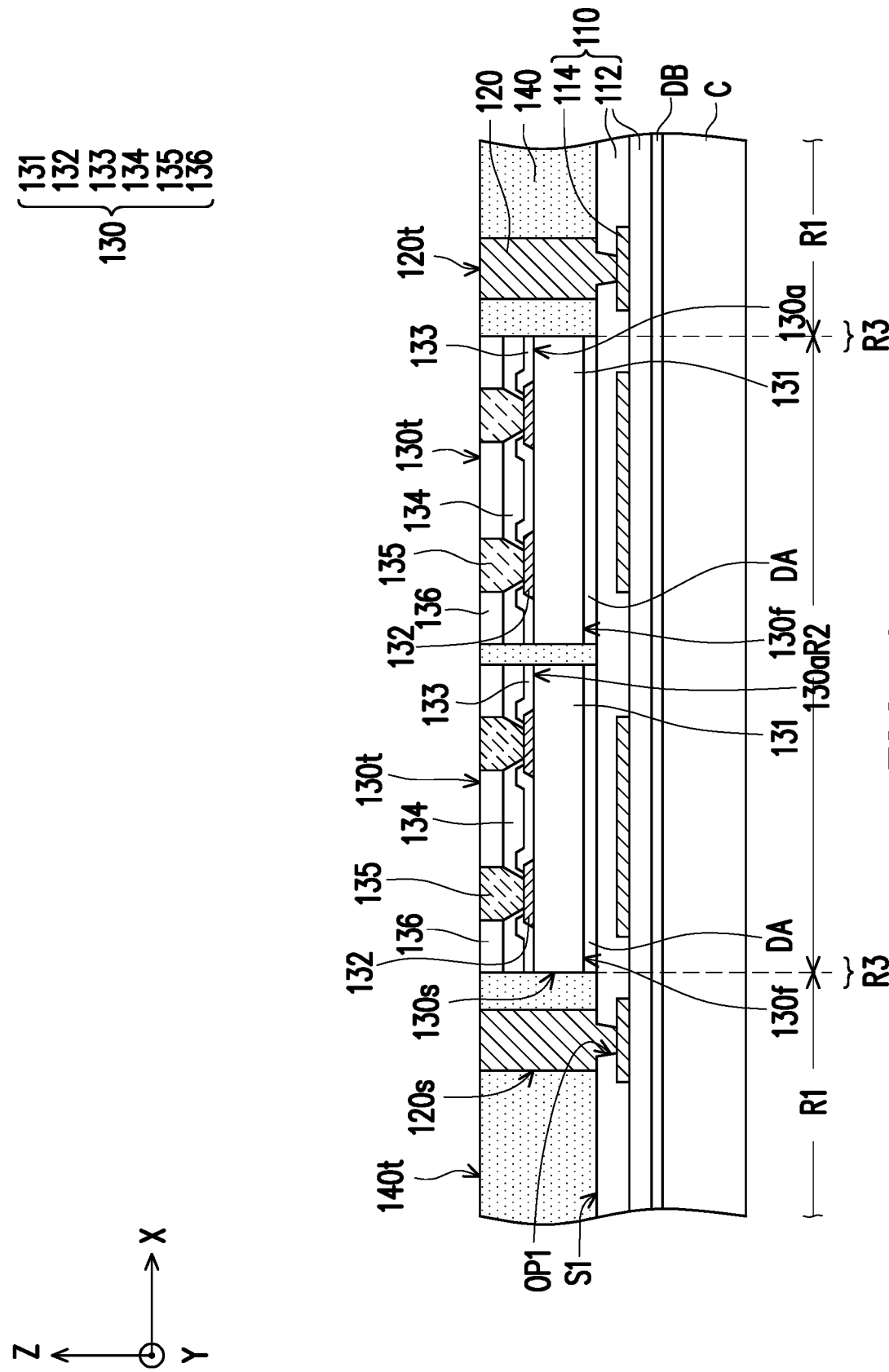

Referring to FIG. 6, in some embodiments, the insulating encapsulation 140a is planarized to form an insulating encapsulation 140 exposing the conductive pillars 120 and the semiconductor dies 130. In certain embodiments, as shown in FIG. 6, after the planarization, top surfaces 120t of the conductive pillars 120 and top surfaces 130t of the semiconductor dies 130 (e.g. top surfaces (not labelled) of the connecting vias 135 and the protection layers 136 of the semiconductor dies 130) are exposed by a top surface 140t of the insulating encapsulation 140. That is, for example, the top surfaces 130t and the top surfaces 120t of the conductive pillars 120 become substantially leveled with the top surface 140t of the insulating encapsulation 140. In other words, the top surfaces 130t of the semiconductor dies 130, the top surfaces 120t of the conductive pillars 120, and the top surface 140t of the insulating encapsulation 140 are substantially coplanar to each other. In other words, the conductive pillars 120 penetrate through the insulating encapsulation 140, while the semiconductor dies 130 are embedded inside the insulating encapsulation 140 with the top surfaces 130t exposed therefrom. For example, as shown in FIG. 6, the conductive pillars 120 and the semiconductor dies 130 are accessibly revealed by the insulating encapsulation 140.

The insulating encapsulation 140a may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140a, the connecting vias 135 and the protection layers 136 of the semiconductor dies 130 and the conductive pillars 120 may also be planarized. In certain embodiments, the planarizing step may, for example, be performed on the over-molded insulating encapsulation 140a to level the top surface 140t of the insulating encapsulation 140, the top surfaces 120t of the conductive pillars 120 and the top surfaces 130t of the semiconductor dies 130.

Figure 7:
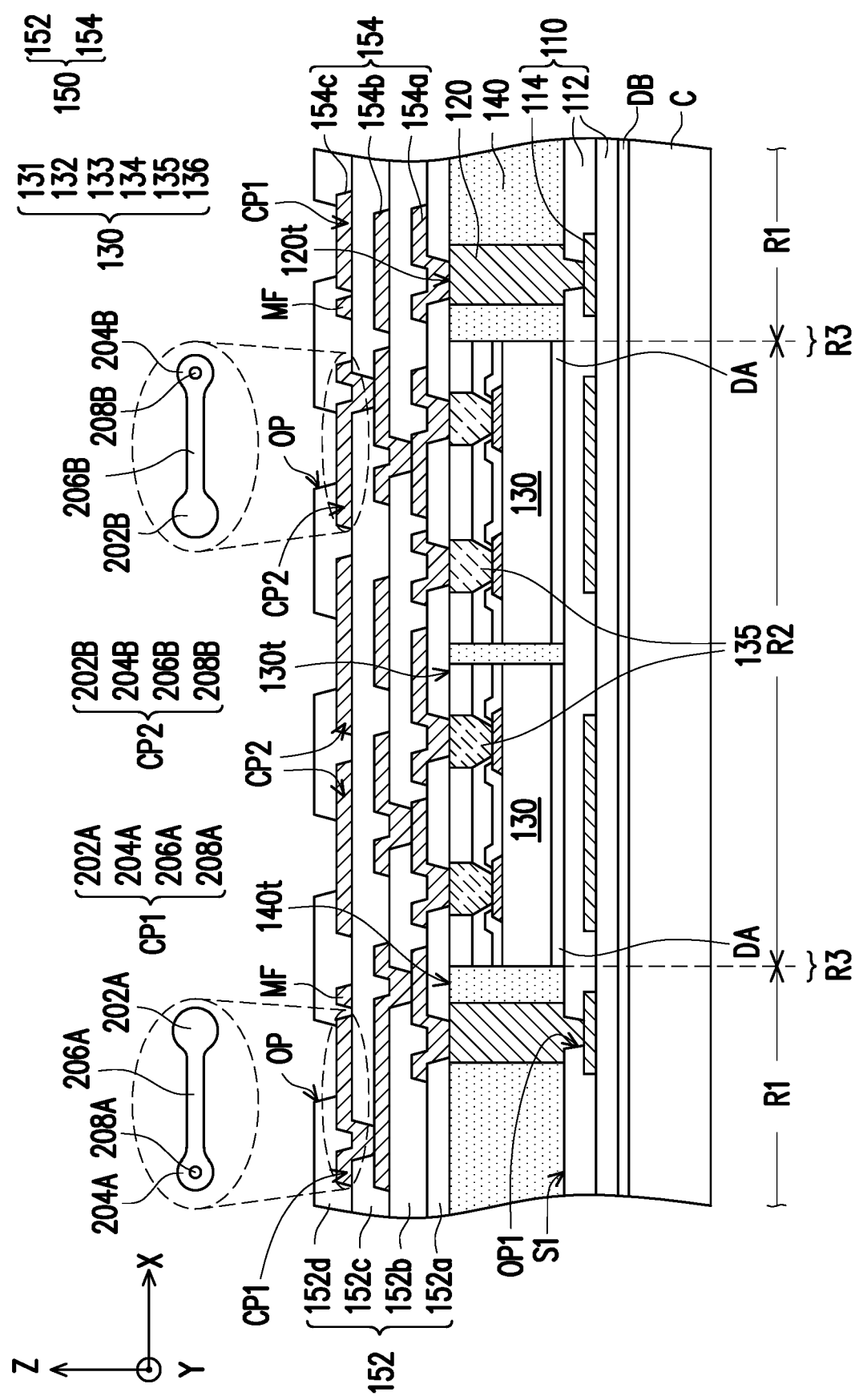

Referring to FIG. 7, in some embodiments, a redistribution circuit structure 150 is formed on the conductive pillars 120, the semiconductor dies 130, and the insulating encapsulation 140. As shown in FIG. 7, the redistribution circuit structure 150 is directly formed on the top surfaces 120t of the conductive pillars 120, the top surfaces 130t of the semiconductor dies 130, and the top surface 140t of the insulating encapsulation 140, for example. In some embodiments, the redistribution circuit structure 150 is electrically connected to the conductive pillars 120, and is electrically connected to the semiconductor dies 130 through the connecting vias 135. In some embodiments, through the redistribution circuit structure 150, the semiconductor dies 130 are electrically connected to each other. In other word, the semiconductor dies 130 are electrically communicated through the redistribution circuit structure 150. In some embodiments, through the redistribution circuit structure 150, the semiconductor dies 130 are electrically connected to the conductive pillars 120. In some embodiments, through the redistribution circuit structure 150 and the conductive pillars 120, the semiconductor dies 130 are electrically connected to the redistribution circuit structure 110. As shown in FIG. 7, for example, the redistribution circuit structure 150 is referred to as a front-side redistribution layer of the semiconductor dies 130.

In some embodiments, as shown in FIG. 7, along the stacking direction (e.g. the direction Z), the semiconductor dies 130 are directly located between the redistribution circuit structure 150 and the connecting films DA, and the conductive pillars 120 and the insulating encapsulation 140 are directly located between the redistribution circuit structure 150 and the redistribution circuit structure 110. In some embodiments, the formation of the redistribution circuit structure 150 includes sequentially forming one or more dielectric layers 152 and one or more metallization layers 154 in alternation. For example, as shown in FIG. 7, the redistribution circuit structure 150 includes dielectric layers 152a, 152b, 152c, 152d and the metallization layers 154a, 154b, 154c. In some embodiments, the metallization layer 154a is sandwiched between the dielectric layers 152a and 152b, the metallization layer 154b is sandwiched between the dielectric layers 152b and 152c, the metallization layer 154c is sandwiched between the dielectric layers 152c and 152d.

In some embodiments, the material and formation of the dielectric layers 152 may be the same as the material and formation of the dielectric layers 112, and the material and formation of the metallization layers 154 may be the same as the material and formation of the metallization layer 114, thus is not repeated herein. In an alternative embodiment, the material of the dielectric layers 152 may be the same as or different from the material of the dielectric layers 112. In an alternative embodiment, the material of the metallization layers 154 may be the same as or different from the material of the metallization layer 114. The disclosure is not limited thereto. It should be noted that the redistribution circuit structure 150 is not limited to include four dielectric layers and three metallization layers. For example, the number of the metallization layers and the numbers of the dielectric layers may be one or more than one.

In some embodiments, a seed layer (not shown) may be formed between one metallization layer 154 and a respective one dielectric layer 152 underlying thereto. In some embodiments, the seed layer may be referred to as a metal layer, which may be a single layer or a composite layer comprising a plurality of sub-layers formed of different materials. In some embodiments, a material of the seed layer may include titanium, copper, molybdenum, tungsten, titanium nitride, titanium tungsten, combinations thereof, or the like. For example, the seed layer may include a titanium layer and a copper layer over the titanium layer. In some embodiments, the seed layer may be formed using, for example, sputtering, physical vapor deposition (PVD), or the like.

Continued on FIG. 7, in some embodiments, portions of a top surface of a topmost layer (e.g. the metallization layer 154c) of the metallization layers 154 are exposed by a topmost layer (e.g. the dielectric layer 152d) of the dielectric layers 152 to electrically connect overlying conductive features (e.g. bump metallurgy (UBM) patterns and/or conductive connectors), and portions of a bottom surface of a lowest layer (e.g. the metallization layer 154a) of the metallization layers 154 are exposed by a lowest layer (e.g. the dielectric layer 152a) of the dielectric layers 152 to electrically connect underlying conductive features (e.g. the conductive pillars 120 and the connecting vias 135 of the semiconductor dies 130). As shown in FIG. 7, in some embodiments, the redistribution circuit structure 110, the conductive pillars 120, and the redistribution circuit structure 150 provide a routing function for the semiconductor dies 130.

In some embodiments, the topmost layer (e.g. the metallization layer 154c) of the metallization layers 154 includes a plurality of first conductive patterns CP1 and a plurality of second conductive patterns CP2. As illustrated in FIG. 7, in some embodiments, the first conductive patterns CP1 each has a contact pad 202A, a contact pad 204A, a conductive trace 206A physically and electrically connecting the contact pad 202A and the contact pad 204A, and a conductive via 208A connecting to the contact pad 204A. For example, for each first conductive pattern CP1, the contact pad 202A is electrically connected to an overlaying conductive feature while the contact pad 204A is electrically connected to an underlying conductive feature through the conductive via 208A. In some embodiments, the second conductive patterns CP2 each has a contact pad 202B, a contact pad 204B, a conductive trace 206B physically and electrically connecting the contact pad 202B and the contact pad 204B, and a conductive via 208B connecting to the contact pad 204B. For example, for each second conductive pattern CP2, the contact pad 202B is electrically connected to an overlaying conductive feature while the contact pad 204B is electrically connected to an underlying conductive feature through the conductive via 208B. As shown in FIG. 7, for example, the contact pads 202A and 202B included in the metallization layer 154c are exposed by openings OP formed in the dielectric layer 152d. That is, one overlying conductive features of the metallization layer 154c may be electrically connected to the redistribution circuit structure 150 through physically and electrically connecting to at least one of the contact pads 202A of the first conductive patterns CP1 or at least one of the contact pads 202B of the second conductive patterns CP2. In the disclosure, the first conductive patterns CP1 and the second conductive patterns CP2 are referred to as a part of routing lines in the redistribution circuit structure 150.

In some embodiments, the first conductive patterns CP1 and the second conductive patterns CP2 are physically spacing apart and separated from one another. In some embodiments, a pitch between two adjacent first conductive patterns CP1 is substantially equal to a pitch between two adjacent second conductive patterns CP2. However, the disclosure is not limited thereto. In one embodiment, the pitch between two adjacent first conductive patterns CP1 is less than the pitch between two adjacent second conductive patterns CP2. In an alternative embodiment, the pitch between two adjacent first conductive patterns CP1 is greater than the pitch between two adjacent second conductive patterns CP2.

In some embodiments, the first conductive patterns CP1 and the second conductive patterns CP2 are electrically isolated from one another. In some alternative embodiments, some of the first conductive patterns CP1 and some the second conductive patterns CP2 are electrically connected to each other through the other metallization layers 154. The electrical connection relationship between the first conductive patterns CP1 and the second conductive patterns CP2 may be designated based on the demand and design layout, the disclosure is not limited thereto. The number of the first conductive patterns CP1 and the number of the second conductive patterns CP2 are not limited thereto, in addition.

As illustrated in FIG. 7 and FIG. 12 together, on the X-Y plane, in some embodiments, dummy regions R3 are respectively located on (cover) corners of the region R2, where an overlapping area between the region R2 and each dummy region R3 is greater than or substantially equal to about 10600900 $\mu m^2$. For example, as shown in FIG. 12, each corner of the region R2 is only overlapped with a respective one dummy region R3, where each dummy region R3 is partially overlapped with the region R1 and the region R2, respectively. In some embodiments, a distance D3 measure from one corner of the region R2 to an edge of a respective one dummy region R3 overlapped therewith is greater than or substantially equal to 515 $\mu m$, where the edge of the respective one dummy region R3 is not overlapped with the edge of the region R2. In certain embodiments, the edges of each dummy region R3, which are not overlapped with (intersected with) the edges of the region R2, may be overlapped with or extended to edges of the region R1. In some embodiments, a distance D4 measure from one corner of the region R2 to a corner of a respective one dummy region R3 is greater than or substantially equal to 730 μm along a diagonal line of the region R2, where the corner of the respective one dummy region R3 is located within the region R1, and the corner of the respective one dummy region R3 and the one corner of the region R2 are located at the diagonal line of the region R2. In certain embodiments, the corner of each dummy region R3, which is located outside of the region R2, may be overlapped with or extended to a respective one of corners of the region R1.

In the disclosure, no first conductive patterns CP1 is disposed in the dummy regions R3. In other words, the first conductive patterns CP1 are disposed within the region R1 except a portion of the region R1 overlapped with the dummy regions R3, and the second conductive patterns CP2 are disposed within the region R2 (with or without a portion of the region R2 overlapped with the dummy regions R3). In alternative embodiments, the first conductive patterns CP1 are disposed within the region R1 except a portion of the region R1 overlapped with the dummy regions R3, and the second conductive patterns CP2 are disposed within the region R1 and the region R2 (with or without a portion of the region R1 and/or a portion of the region R2 overlapped with the dummy regions R3). That is, in the disclosure, the first conductive patterns CP1 are not located in the region R2 and the region R1 overlapped with the dummy regions R3.

The number of the dummy regions R3 is not limited to the disclosure, and may be determined or selected based on the demand and the design layout. The number of the dummy regions R3 may be corresponding to the number of the corners of the regions R2, for example. In some embodiments, on the X-Y plane, the shape of the dummy regions R3 may be a rectangular shape, the disclosure is not limited thereto.

Continued on FIG. 7, in some embodiments, in a projection on the redistribution circuit structures 110 or the redistribution circuit structures 150 along the stacking direction (e.g. the direction Z), a positioning location of the first conductive patterns CP1 is overlapped with a positioning location of the insulating encapsulation 140 and a positioning location of the conductive pillars 120 and is aside of the positioning location of the semiconductor dies 130. In other words, in the projection on the redistribution circuit structures 110 or the redistribution circuit structures 150 along the stacking direction (e.g. the direction Z), the positioning location of the first conductive patterns CP1 is not overlapped with the positioning location of the semiconductor dies 130.

In some embodiments, in a projection on the redistribution circuit structures 110 or the redistribution circuit structures 150 along the stacking direction (e.g. the direction Z), a positioning location of the second conductive patterns CP2 is overlapped with the positioning location of the semiconductor dies 130 and is aside of the positioning location of the insulating encapsulation 140 and the positioning location of the conductive pillars 120. In other words, in the projection on the redistribution circuit structures 110 or the redistribution circuit structures 150 along the stacking direction (e.g. the direction Z), the positioning location of the second conductive patterns CP2 is not overlapped with the positioning location of the insulating encapsulation 140 and the positioning location of the conductive pillars 120.

However, the disclosure is not limited thereto. In some alternative embodiments, in the projection on the redistribution circuit structures 110 or the redistribution circuit structures 150 along the stacking direction (e.g. the direction Z), the positioning location of the second conductive patterns CP2 is overlapped with the positioning location of the semiconductor dies 130, the positioning location of the insulating encapsulation 140 and the positioning location of the conductive pillars 120.

Figure 8:
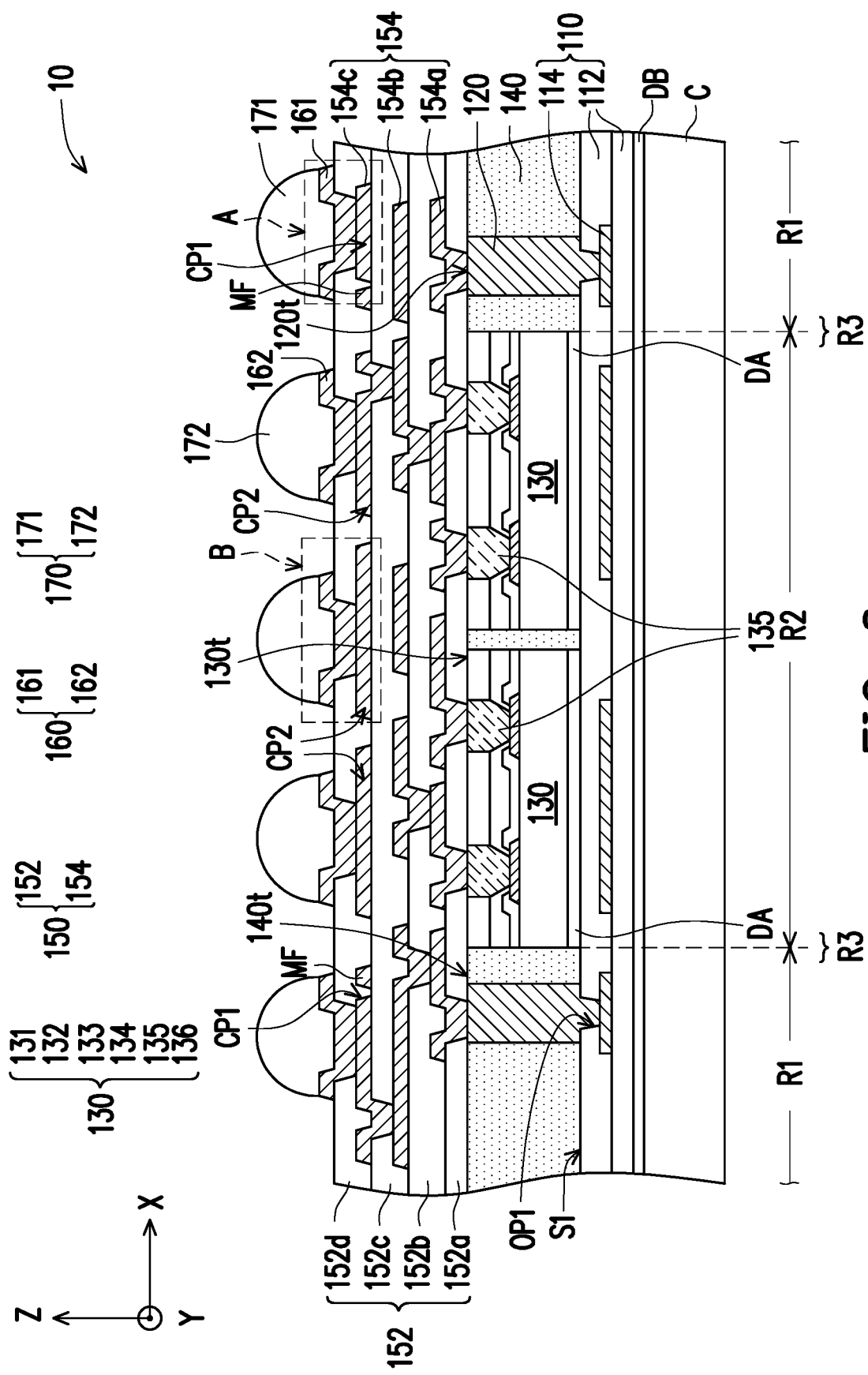
Figure 9:
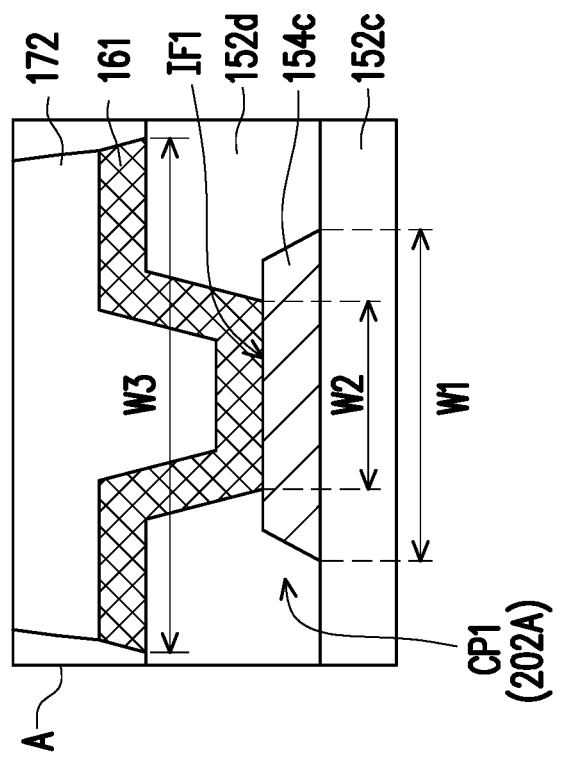
FIG. 9 is an enlarged, schematic cross sectional view of a portion of the package structure depicted in FIG. 8.

Referring to FIG. 8, in some embodiments, a plurality of UBM patterns 160 are formed to be disposed on the exposed top surfaces of the topmost layer (e.g. the metallization layer 154c) of the metallization layers 154 for electrically connecting with conductive elements (e.g. conductive balls or conductive bumps). As shown in FIG. 8, for example, the UBM patterns 160 includes UBM pattern 161 and UBM patterns 162, where the UBM patterns 161 are physically formed on and electrically connected to the contact pads 202A of the first conductive patterns CP1 included in the metallization layer 154c of the redistribution circuit structure 150, and the UBM patterns 162 are physically formed on and electrically connected to the contact pads 202B of the second conductive patterns CP2 included in the metallization layer 154c of the redistribution circuit structure 150. In other words, the UBM patterns 160 (including the UBM pattern 161 and the UBM patterns 162) are electrically connected to the redistribution circuit structure 150 through the first conductive patterns CP1 and the conductive patterns CP2. In other words, the UBM patterns 161 are located within the region R1 while the UBM patterns 162 are located with the region R2, for example, as shown in FIG. 8. In alternative embodiments, the UBM patterns 161 are located within the region R1 while the UBM patterns 162 are located within the region R1 and the region R2.

The materials of the UBM patterns 160 may include copper, nickel, titanium, tungsten, or alloys thereof or the like, and may be formed by an electroplating process, for example. The numbers of the UBM pattern 161 and the UBM patterns 162 included in the UBM patterns 160 are not limited in this disclosure, and corresponds to the numbers of the first conductive patterns CP1 (e.g. the contact pads 202A) and the second conductive patterns CP2 (e.g. the contact pads 202B) formed in the metallization layers 154c exposed by the dielectric layers 152d.

Continued on FIG. 8, in some embodiments, after the UBM patterns 160 are formed, a plurality of conductive terminals 170 are formed on the UBM patterns 160 and over the redistribution circuit structure 150. In some embodiments, the conductive terminals 170 are disposed on the UBM patterns 160 over the redistribution circuit structure 150. As shown in FIG. 8, for example, the conductive terminals 170 includes conductive terminals 171 and conductive terminals 172, where the conductive terminals 171 are physically formed on and electrically connected to the UBM patterns 161, and the conductive terminals 172 are physically formed on and electrically connected to the UBM patterns 162. In other words, the conductive terminals 170 (including the conductive terminals 171 and the conductive terminals 172) are electrically connected to the redistribution circuit structure 150 through the UBM patterns 161 and the UBM patterns 162. In other words, the conductive terminals 171 are located within the region R1 while the conductive terminals 172 are located with the region R2, for example, as shown in FIG. 8. In alternative embodiments, the conductive terminals 171 are located within the region R1 while the conductive terminals 172 are located within the region R1 and the region R2.

In some embodiments, the conductive terminals 170 may be disposed on the UBM patterns 160 by ball placement process or reflow process. In some embodiments, the conductive terminals 170 are, for example, controlled collapse chip connection (C4) bumps, ball grid array (BGA) balls, solder balls/bumps or other connectors. The number of the conductive terminals 170 (including the conductive terminals 171 and 172) is not limited to the disclosure, and may be designated and selected based on the number of the UBM patterns 160 (e.g. the numbers of the UBM patterns 161 and the UBM patterns 162, respectively). When solder is used, the solder may include either eutectic solder or non-eutectic solder. The solder may include lead or be lead-free, and may include Sn—Ag, Sn—Cu, Sn—Ag—Cu, or the like. In the disclosure, for one embodiment, the conductive terminals 170 may be referred to as conductive connectors for connecting with another package; or for another embodiment, the conductive terminals 170 may be referred to as conductive terminals for inputting/outputting electric and/or power signals.

In some embodiments, the conductive terminals 170 are connected to the redistribution circuit structure 150 through the UBM patterns 160. In some embodiments, some of the conductive terminals 170 are electrically connected to the semiconductor dies 130 through the UBM patterns 160 and the redistribution circuit structure 150. In some embodiments, some of the conductive terminals 170 are electrically connected to the conductive pillars 120 through the UBM patterns 160 and the redistribution circuit structure 150. In some embodiments, some of the conductive terminals 170 are electrically connected to the redistribution circuit structure 110 through the UBM patterns 160, the redistribution circuit structure 150 and the conductive pillars 120.

As illustrated in FIG. 8 and FIG. 9 together, in some embodiments, for each first conductive pattern CP1 formed in the metallization layer 154c, along the X-Y plane, a width W1 of the contact pad 202A is less than a width W3 of the respective one UBM pattern 161 overlying thereto (e.g. W1<W3), where the width W1 of the contact pad 202A is greater than or substantially equal to a width W2 of an interface IF1 between the first conductive pattern CP1 and a respective one UBM pattern 161 overlying thereto (e.g. W1>W2), and the width W2 of the interface IF1 is less than or substantially equal to a width W3 of the respective one UBM pattern 161 overlying thereto (e.g. W3>W2). For example, a ratio of the width W1 and the width W3 is substantially equal to or greater than about 0.61 and is less than about 1. For example, a ratio of the width W2 and the width W3 is substantially equal to or greater than about 0.53 and is substantially equal to or less than about 1.00.

As illustrated in FIG. 8 and FIG. 10 together, in some embodiments, for each second conductive pattern CP2 formed in the metallization layer 154c, along the X-Y plane, a width W4 of the contact pad 202B is greater than or substantially equal to a width W6 of the respective one UBM pattern 162 overlying thereto (e.g. W4>W6), where the width W4 of the contact pad 202B is greater than or substantially equal to a width W5 of an interface IF2 between the second conductive pattern CP2 and a respective one UBM pattern 162 overlying thereto (e.g. W4>W5), and the width W5 of the interface IF2 is less than or substantially equal to the width W6 of the respective one UBM pattern 162 overlying thereto (e.g. W6>W5). For example, a ratio of the width W4 and the width W6 is substantially equal to or greater than about 1.00 and is substantially equal to or less than about 1.15. For example, a ratio of the width W5 and the width W6 is substantially equal to or greater than about 0.43 and is substantially equal to or less than about 1.00.

In the disclosure, the width W1 of the contact pad 202A is less than the width W4 of the contact pad 202B. Owing to the contact pads 202A, more available routing area/regions between two adjacent contact pads 202A in the topmost layer (e.g. the metallization layer 154c) of the metallization layers 154 of the redistribution circuit structure 150 are released for the package structure 10, which allows additional routing lines/wires (e.g. additional conductive patterns similar to the first conductive pattern CP1 and/or the second conductive pattern CP2) formed in the metallization layers 154 of the redistribution circuit structure 150, thereby enhancing the performance of the package structure 10. In addition, the manufacturing cost of the package structure 10 may be further reduced.

In some embodiments, the width W2 of an interface IF1 is less than the width W5 of an interface IF2. In other words, a contact area between the first conductive pattern CP1 and a respective one UBM pattern 161 overlying thereto is less than a contact area between the second conductive pattern CP2 and a respective one UBM pattern 162 overlying thereto, for example. In some alternative embodiments, the width W2 of an interface IF1 is substantially equal to the width W5 of an interface IF2. In other words, a contact area between the first conductive pattern CP1 and a respective one UBM pattern 161 overlying thereto is substantially equal to a contact area between the second conductive pattern CP2 and a respective one UBM pattern 162 overlying thereto, for example. In some embodiments, the width W3 of the respective one UBM pattern 161 disposed on the contact pad 202A is less than the width W6 of the respective one UBM pattern 162 disposed on the contact pad 202B. In some alternative embodiments, the width W3 of the respective one UBM pattern 161 disposed on the contact pad 202A is substantially equal to the width W6 of the respective one UBM pattern 162 disposed on the contact pad 202B. For example, in the embodiments of which the width W2 of an interface IF1 is less than the width W5 of an interface IF2 and the width W3 of the respective one UBM pattern 161 disposed on the contact pad 202A is less than the width W6 of the respective one UBM pattern 162 disposed on the contact pad 202B, a pitch of two any adjacent UBM patterns 161 is further reduced, and thus the number of the conductive terminals 171 of the package structure 10 is increased, thereby the performance of the package structure 10 is further enhanced. In other words, the overall number of the conductive terminals 170 of the package structure 10 is increased.

As illustrated in FIG. 8 and FIG. 11 together, in some embodiments, for each first conductive pattern CP1, the contact pad 202A of the first conductive pattern CP1 is surrounded by one buffer region BR, where the buffer region BR has a closed ring pattern or an annular pattern and is overlapped with a respective one UBM patterns 161 physically connecting to the contact pad 202A of the first conductive pattern CP1, and the buffer region BR and the respective one UBM patterns 161 are concentric. In some embodiments, as shown in FIG. 11, a distance D1 from the inner side S1 of the buffer region BR to an edge of the respective UBM pattern 161 is substantially equal to a distance D2 from the outer side S2 of the buffer region BR to an edge of the respective UBM pattern 161. For example, a ratio of the distance D1 to the width W3 of the respective UBM pattern 161 is ranging about 0.075 to about 0.15, and similarly, a ratio of the distance D2 to the width W3 of the respective UBM pattern 161 is ranging about 0.075 to about 0.15. In some embodiments, the distance D1 is equal to the distance D2, however, the disclosure is not limited thereto. In some alternative embodiments, the distance D1 may be different from the distance D2.

In the disclosure, at least 50% of an overall area of the buffer region BR has metal features MF disposed therein to ensure the mechanical strength of the package structure 10.

In some embodiments, the above metal features MF may include the routing lines/wires (such as additional routing lines/wires, the first conductive pattern CP1, and/or the second conductive patterns CP2), dummy metal wires/lines/segments, or the like. In some embodiments, the above metal features MF may be electrically isolated or electrically connected to the first conductive pattern CP1 or may be electrically isolated or electrically connected to the second conductive pattern CP2, based on the demand and design layout, the disclosure is not limited thereto. In some embodiments, on the X-Y plane, each buffer region BR is not overlapped with the contact pad 202A surrounded therefrom. In some alternative embodiments, on the X-Y plane, each buffer region BR may be partially overlapped with the contact pad 202A surrounded therefrom.

Up to here, the manufacture of the package structure 10 is completed. The package structure 10 depicted in FIG. 8 may be referred to as an integrated fan-out (semiconductor) package structure. In some embodiments, a dicing process is performed to cut the wafer having a plurality of the package structures 10 into individual and separated package structures 10 without debonding the carrier C, and the carrier C may serve as a heat dissipating element for the package structure 10. In some embodiments, the carrier C is further used for controlling the warpage of the package structures 10. In one embodiment, the dicing process is a wafer dicing process including mechanical blade sawing or laser cutting.

Figure 13:
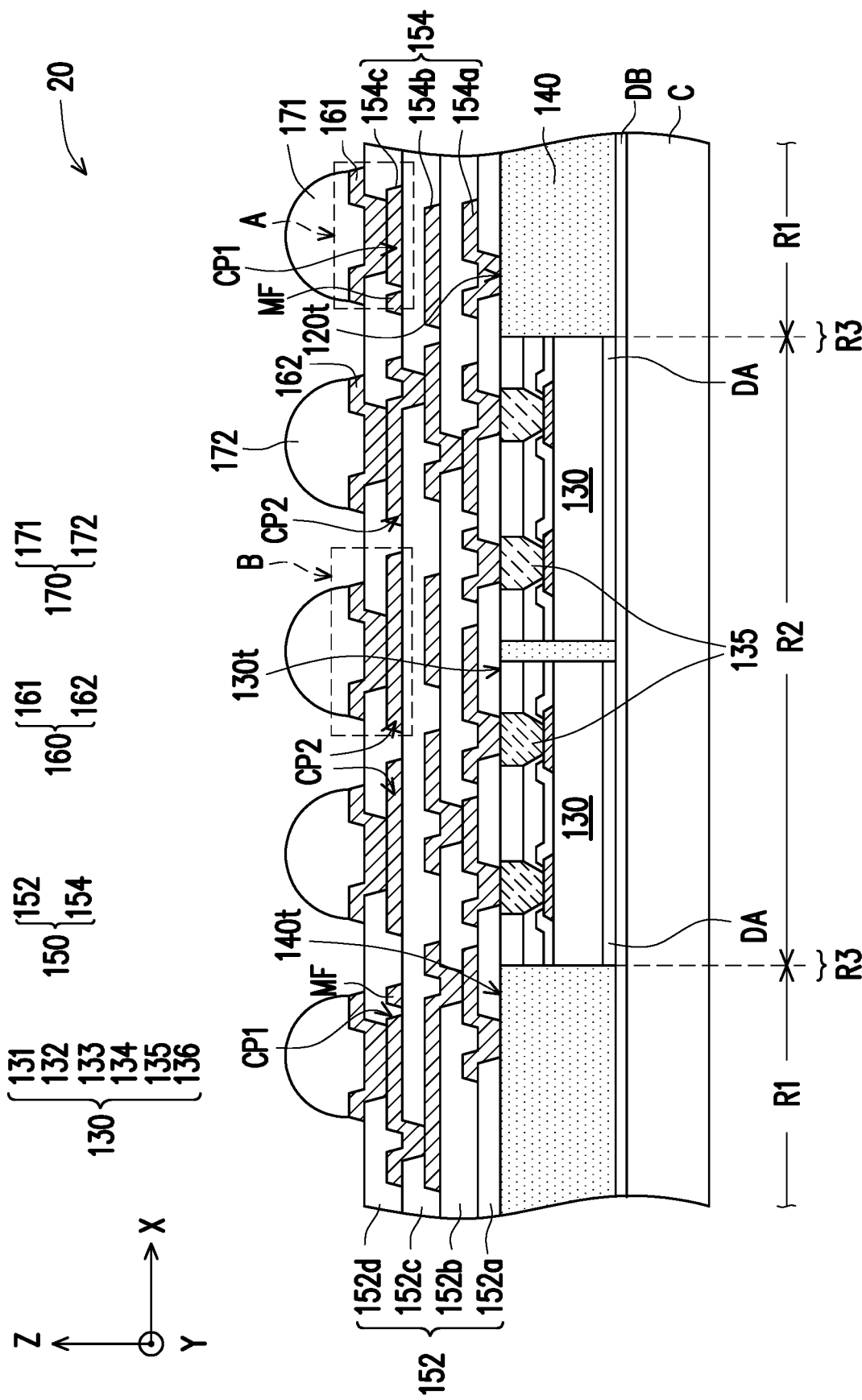
FIG. 13 is a schematic cross sectional view of a package structure in accordance with some embodiments of the present disclosure.
Figure 14:
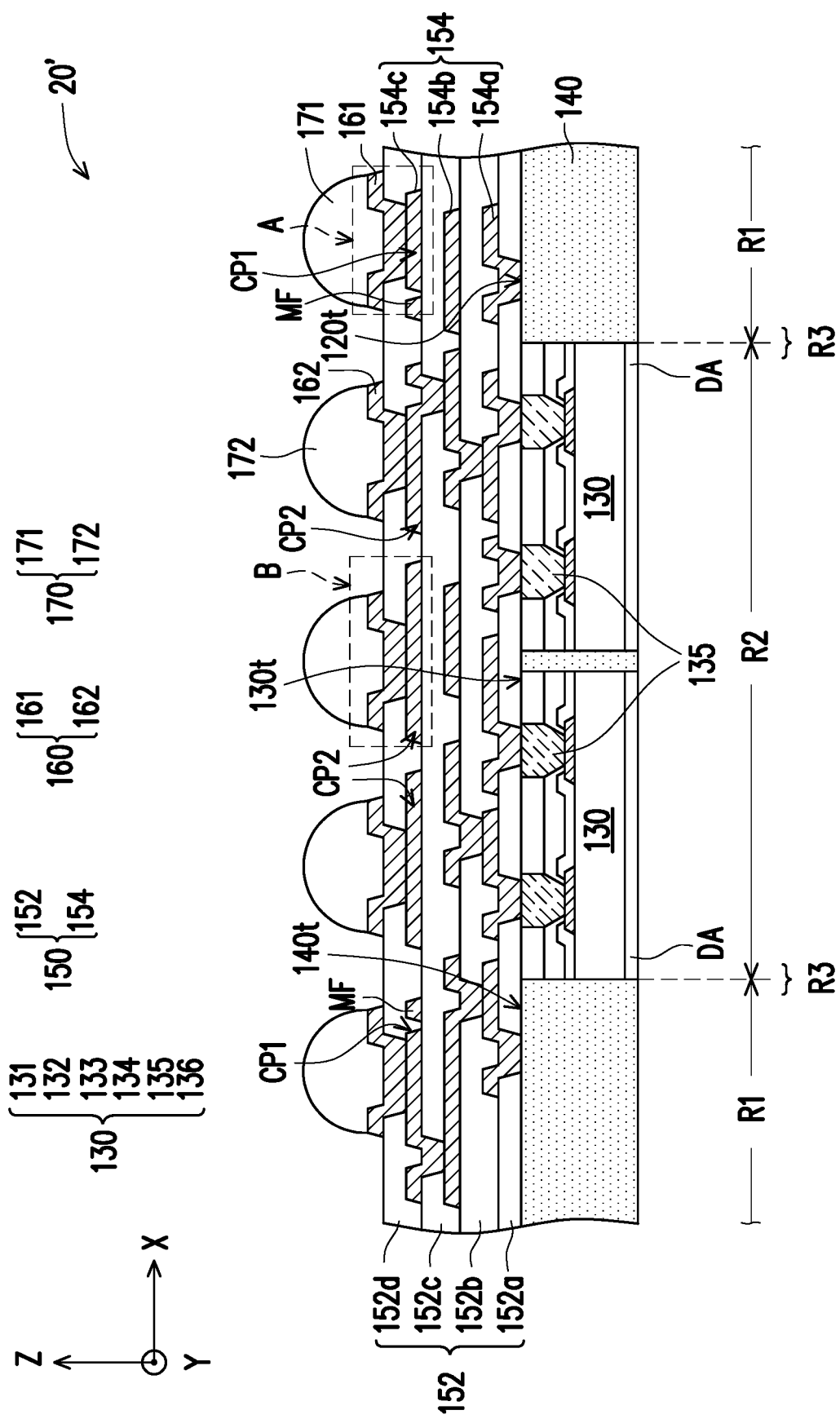
FIG. 14 is a schematic cross sectional view of a package structure in accordance with some embodiments of the present disclosure.

However, the disclosure is not limited thereto. In an alternative embodiment, the conductive pillars 120 and the redistribution circuit structure 110 may be omitted from the package structure 10, see a package 20 depicted in FIG. 13. In one embodiment, the carrier C may be further debonded from the insulating encapsulation 140 and the semiconductor dies 130 before the dicing process, see a package 20' depicted in FIG. 14. In one embodiment, the debonding process is a laser debonding process.

In some embodiments, the package structures 10, 20, 20' may be further mounted with a circuit substrate, an interposer, an additional package, chips/dies or other electronic devices to form a stacked package structure or a package on package (PoP) structure through the conductive terminals 170.

FIG. 15 to FIG. 18 are schematic cross sectional views of various stages in a manufacturing method of a package structure in accordance with some embodiments of the present disclosure. The elements similar to or substantially the same as the elements described previously will use the same reference numbers, and certain details or descriptions (e.g. the materials, formation processes, positioning configurations, etc.) of the same elements would not be repeated herein.

Figure 15:
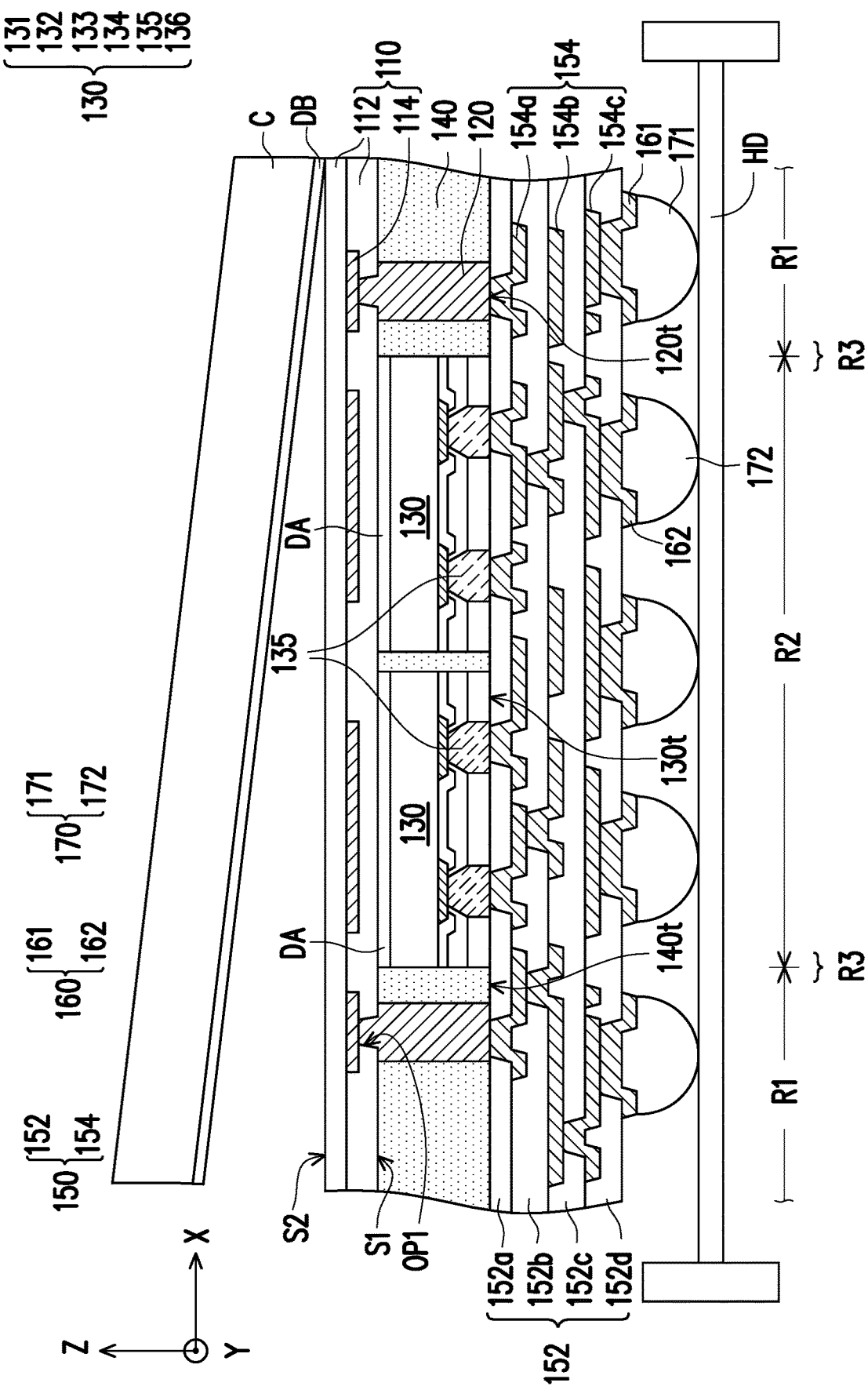
FIG. 15 to FIG. 18 are schematic cross sectional views of various stages in a manufacturing method of a package structure in accordance with some embodiments of the present disclosure.
Figure 16:
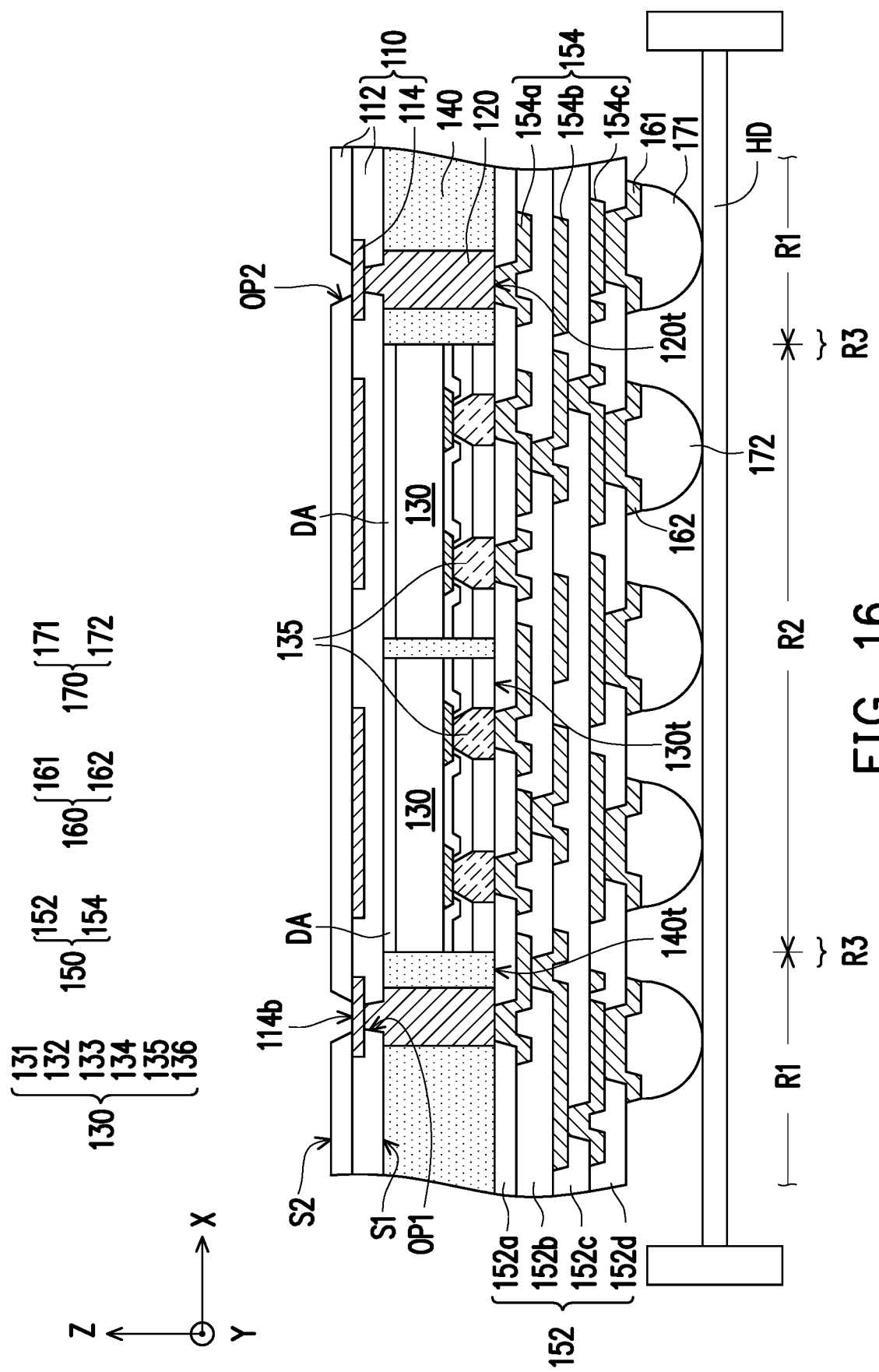

Referring to FIG. 15, in some embodiments, the package structure 10 depicted in FIG. 8 along with the carrier C is flipped (turned upside down), where the conductive terminals 170 are placed to a holding device HD, and the carrier C is then debonded from the redistribution circuit structure 110. The detail of the package structure 10 is described in FIG. 1 to FIG. 8 and FIG. 9 to FIG. 12, and thus are not repeated herein. In some embodiments, the holding device HD may be an adhesive tape, a carrier film or a suction pad. The disclosure is not limited thereto.

In some embodiments, the redistribution circuit structure 110 is easily separated from the carrier C due to the debond layer DB. In some embodiments, the carrier C is detached from the redistribution circuit structure 110 through a debonding process, and the carrier C and the debond layer DB are removed. For example, a surface S2 of the redistribution circuit structure 110 is exposed, where the surface S2 is opposite to the surface S1, as show in FIG. 15. In one embodiment, the debonding process is a laser debonding process. During the debonding step, the holding device HD is used to secure the package depicted in FIG. 8 before debonding the carrier C and the debond layer DB.

Referring to FIG. 15, in some embodiments, the redistribution circuit structure 110 exposed from the debonding step is patterned to expose portions of the metallization layer 114. In some embodiments, the bottommost layer (depicted in FIG. 2 to FIG. 8) of the dielectric layers 112 is patterned to form a plurality of openings OP2 respectively exposing portions of a bottom surface 114b of the metallization layer 114, where the bottom surface S2 is opposite to the top surface S1. The patterning step may, for example, include a laser drilling process; however, the disclosure is not limited thereto. The number of the openings OP2 is not limited thereto, and may be designated and selected based on the demand.

Figure 17:
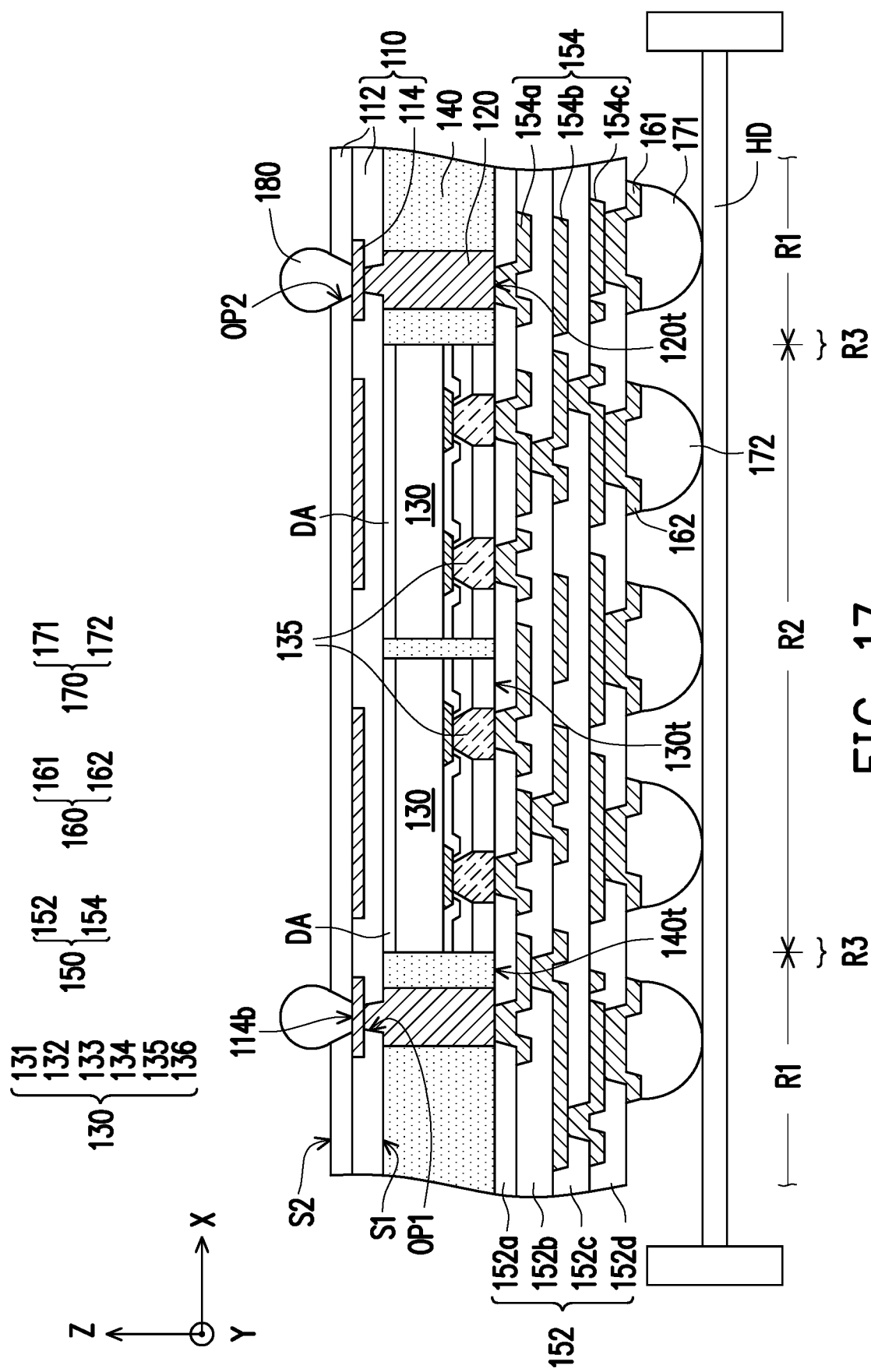

Referring to FIG. 17, in some embodiments, after the formation of the openings OP2, conductive terminals 180 are formed on the bottom surface S2 of the redistribution circuit structure 110 to physical connect to the bottom surface 114b of the metallization layer 114 exposed by the openings OP2 formed in the bottommost layer (depicted in FIG. 2 to FIG. 8) of the dielectric layers 112. As shown in FIG. 17, the conductive terminals 180 are electrically connected to the semiconductor dies 130 through the redistribution circuit structure 110, the conductive pillars 120, and the redistribution circuit structure 150, in some embodiments. In some embodiments, through the redistribution circuit structure 110, the conductive pillars 120, the redistribution circuit structure 150, and/or the UBM patterns 160, the conductive terminals 170 are electrically connected to the conductive terminals 180. In certain embodiments, the conductive terminals 180 are pre-solder pastes, for example. In an alternative embodiment, the conductive terminals 180 may be pre-solder blocks. In some embodiments, the material of the conductive terminals 180 may include a lead-free solder material (such as Sn—Ag base or Sn—Ag—Cu base materials) with or without additional impurity (such as Ni, Bi, Sb, Au, or the like). The disclosure is not limited thereto. In the disclosure, the conductive terminals 180 may be referred to as conductive connectors for connecting to another package.

Figure 18:
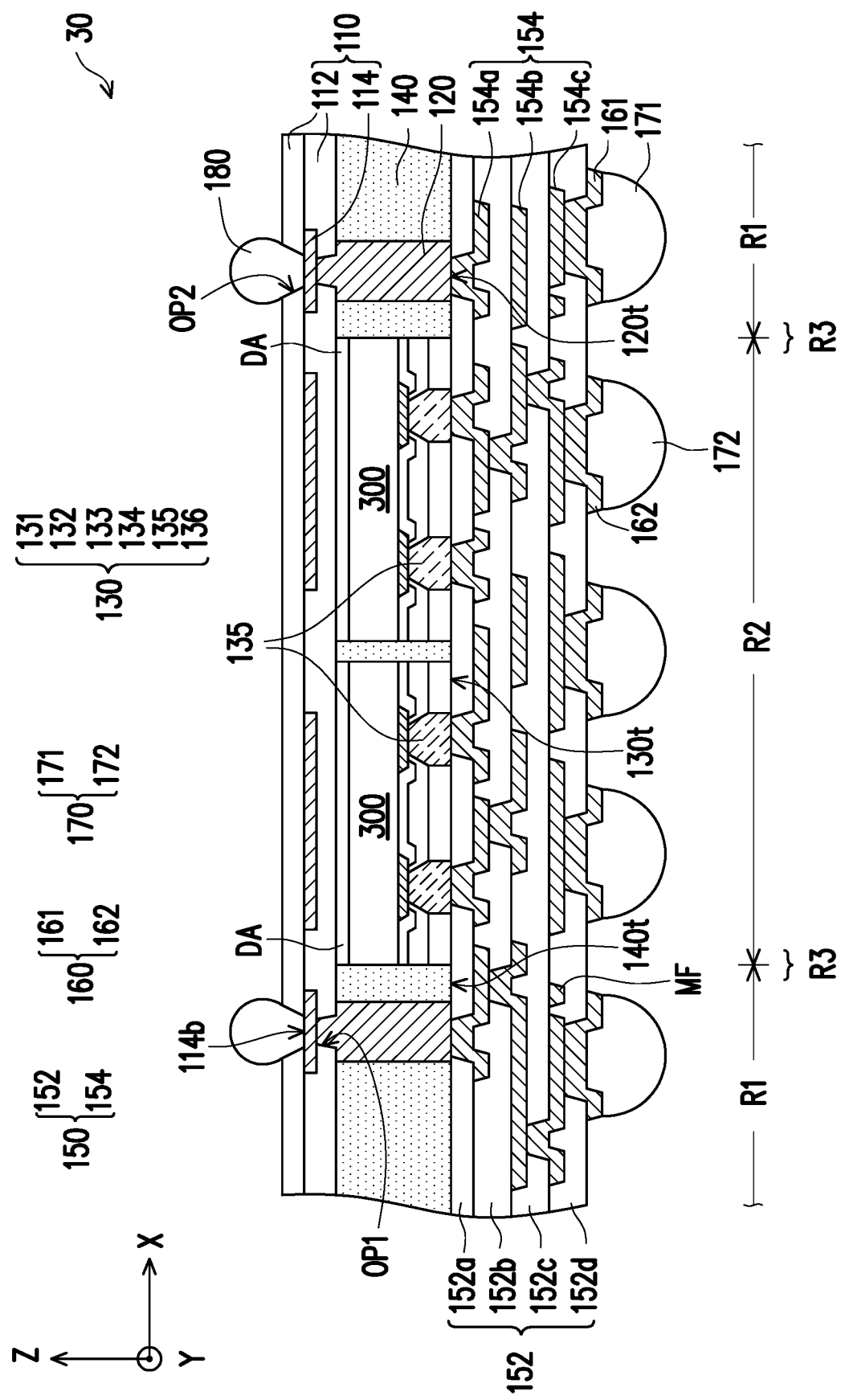

Referring to FIG. 18, in some embodiments, the conductive terminals 170 are released from the holding device HD to form the package structure 30. In some embodiments, a dicing (singulating) process is performed to cut a plurality of the package structures 30 interconnected therebetween into individual and separated package structures 30 before releasing the conductive terminals 170 from the holding device HD. In one embodiment, the dicing process is a wafer dicing process including mechanical blade sawing or laser cutting. Up to here, the manufacture of the package structure 30 is completed. The package structure 30 depicted in FIG. 18 may be referred to as an integrated fan-out (semiconductor) package structure having dual-side terminals.

In some alternative embodiments, the package structures 30 may be further mounted with a circuit substrate, an interposer, an additional package, chips/dies or other electronic devices to form a stacked package structure or a package on package (PoP) structure through the conductive terminals 170 and/or other the conductive terminals 180 based on the design layout and the demand.

In accordance with some embodiments, a package structure includes a semiconductor die, a redistribution circuit structure, and conductive pads. The redistribution circuit structure is located on and electrically connected to the semiconductor die, the redistribution circuit structure includes a first contact pad having a first width and a second contact pad having a second width. The conductive pads are located on and electrically connected to the redistribution circuit structure through connecting to the first contact pad and the second contact pad, the redistribution circuit structure is located between the conductive pads and the semiconductor die. The first width of the first contact pad is less than a width of the conductive pads, and the second width of the second contact pad is substantially equal to or greater than the width of the conductive pads.

In accordance with some embodiments, a package structure includes an insulating encapsulation, a semiconductor die, and a first redistribution circuit structure. The semiconductor die is encapsulated in the insulating encapsulation, wherein a thermal expansion coefficient of the insulating encapsulation is less than a thermal expansion coefficient of the semiconductor die. The first redistribution circuit structure is disposed on the insulating encapsulation and electrically connected to the semiconductor die, the first redistribution circuit structure includes a first contact pad having a first width and a second contact pad having a second width, wherein the first width of the first contact pad is less than the second width of the second contact pad. The package structure has a first region with the insulating encapsulation disposed therein and a second region with the semiconductor die disposed therein, the first contact pad is located within the first region, and the second contact pad is located within the second region.

In accordance with some embodiments, a method of manufacturing package structure includes the following steps, providing a semiconductor die; encapsulating the semiconductor die in an insulating material; forming a first redistribution circuit structure on the insulating material, forming the first redistribution circuit structure comprising forming a first contact pad having a first width and a second contact pad having a second width, the first width is less than the second width; forming conductive pads to connect to the first redistribution circuit structure, wherein the first width of the first contact pad is less than a width of the conductive pads, and the second width of the second contact pad is substantially equal to or greater than the width of the conductive pads; and disposing conductive terminals respectively on the conductive pads to electrically connect the conductive terminals and the first redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a semiconductor die having an active side, comprising a plurality of conductive vias disposed on the active side and a dielectric layer disposed over the active side and covering a sidewall of the plurality of conductive vias;
   an insulating encapsulation, encapsulating the semiconductor die, wherein the active side and the plurality of conductive vias of the semiconductor die are separated from the insulating encapsulation through the dielectric layer;
   a first redistribution circuit structure, disposed on a first side of the insulating encapsulation and electrically coupled to the semiconductor die; and
   a second redistribution circuit structure, disposed on a second side of the insulating encapsulation and electrically coupled to the semiconductor die, the second side being opposite to the first side.

2. The package structure of claim 1, further comprising:
   a plurality of conductive pillars, disposed next to the semiconductor die and penetrating through the insulating encapsulation,
   wherein the plurality of conductive pillars are electrically coupled to the semiconductor die through the first redistribution circuit structure.

3. The package structure of claim 1, further comprising:
   a plurality of first conductive terminals, disposed on and electrically coupled to the first redistribution circuit structure,
   wherein the plurality of first conductive terminals are electrically coupled to the semiconductor die through the first redistribution circuit structure.

4. The package structure of claim 3, further comprising:
   a first additional package, disposed on and connected to the plurality of first conductive terminals,
   wherein the first additional package is electrically coupled to the semiconductor die through the plurality of first conductive terminals and the first redistribution circuit structure.

5. The package structure of claim 1, wherein the insulating encapsulation is sandwiched between the first redistribution circuit structure and the second redistribution circuit structure, wherein the package structure further comprises:
   a plurality of second conductive terminals, disposed on and electrically coupled to the second redistribution circuit structure,
   wherein the plurality of second conductive terminals are electrically coupled to the semiconductor die through the second redistribution circuit structure.

6. The package structure of claim 5, further comprising:
   a second additional package, disposed on and connected to the plurality of second conductive terminals,
   wherein the second additional package is electrically coupled to the semiconductor die through the plurality of second conductive terminals and the second redistribution circuit structure.

7. The package structure of claim 1, further comprising:
   conductive pads, disposed on the first redistribution circuit structure, the first redistribution circuit structure being disposed between the conductive pads and the semiconductor die,
   wherein the first redistribution circuit structure comprises a first contact pad and a second contact pad separated from the first contact pad, and the conductive pads are electrically coupled to the first redistribution circuit structure through connecting to the first contact pad and the second contact pad,
   wherein a first width of the first contact pad is less than a width of the conductive pads, and a second width of the second contact pad is substantially equal to or greater than the width of the conductive pads.

8. The package structure of claim 7, wherein the first width of the first contact pad is less than the second width of the second contact pad.

9. The package structure of claim 7, wherein in a projection on the first redistribution circuit structure along a stacking direction of the semiconductor die and the first redistribution circuit structure, a positioning location of the first contact pad is overlapped with a positioning location of the insulating encapsulation and is free from a positioning location of the semiconductor die, and a positioning location of the second contact pad is overlapped with the positioning location of the semiconductor die.

10. The package structure of claim 9, wherein the positioning location of the second contact pad is further overlapped with the positioning location of the insulating encapsulation.

11. A package structure, comprising:
a semiconductor die;
a redistribution circuit structure, disposed on and electrically coupled to the semiconductor die, the redistribution circuit structure comprising a first contact pad having a first width and a second contact pad having a second width, wherein the first contact pad is separated from the second contact pad, and the first width is less than the second width; and
an insulating encapsulation, encapsulating the semiconductor die and over the redistribution circuit structure,
wherein in a projection on the redistribution circuit structure along a stacking direction of the semiconductor die and the redistribution circuit structure, a positioning location of the first contact pad is aside of a positioning location of the semiconductor die and overlapped with a positioning location of the insulating encapsulation, and a positioning location of the second contact pad is overlapped with the positioning location of the semiconductor die.

12. The package structure of claim 11, wherein in the projection on the redistribution circuit structure along the stacking direction of the semiconductor die and the redistribution circuit structure, the positioning location of the second contact pad is further overlapped with the positioning location of the insulating encapsulation.

13. The package structure of claim 11, further comprising:
conductive pads, disposed on and electrically coupled to the redistribution circuit structure through connecting to the first contact pad and the second contact pad, the redistribution circuit structure being disposed between the conductive pads and the semiconductor die, wherein a width of the conductive pads is greater than the first width and is less than the second width; and
conductive pillars, penetrating through the insulating encapsulation and electrically coupled to the semiconductor die through the redistribution circuit structure, wherein in the projection on the redistribution circuit structure along the stacking direction of the semiconductor die and the redistribution circuit structure, the positioning location of the first contact pad is further overlapped with a positioning location of the conductive pillars.

14. The package structure of claim 13, wherein in the projection on the redistribution circuit structure along the stacking direction of the semiconductor die and the redistribution circuit structure, the positioning location of the second contact pad is further overlapped with the positioning location of the insulating encapsulation, the positioning location of the conductive pillars, or a combination thereof.

15. The package structure of claim 13, further comprising:
conductive connectors, respectively disposed on the conductive pads, wherein the conductive pads are located between the conductive connectors and the redistribution circuit structure, and a contact area between the first contact pad and a respective one conductive pad disposed thereon is substantially equal to or less than a contact area between the second contact pad and a respective one conductive pad disposed thereon.

16. The package structure of claim 11, wherein the first contact pad is surrounded by a buffer region, and at least 50% of an overall area of the buffer region is occupied by a metal feature formed in a same layer where the first contact pad and the second contact pad formed therein.

17. A package structure, comprising:
an insulating encapsulation;
a semiconductor die, encapsulated in the insulating encapsulation; and
a first redistribution circuit structure, disposed on the insulating encapsulation and electrically coupled to the semiconductor die, the first redistribution circuit structure comprising a first contact pad having a first width and a second contact pad having a second width, wherein the first width of the first contact pad is less than the second width of the second contact pad,
wherein the package structure comprises a first region with the insulating encapsulation disposed therein and a second region with the semiconductor die disposed therein, the first contact pad is located within the first region, and the second contact pad is located within the second region.

18. The package structure of claim 17, wherein the package structure further comprises a dummy region overlapped with the first region and the second region and disposed on a corner of the second region, a corner of the dummy region located in the first region is located on an extending direction of a diagonal line of the second region passing through the corner of the second region.

19. The package structure of claim 18, wherein:
the second contact pad is further located within the first region;
the second contact pad is further located within the first region and the dummy region; or
the second contact pad is further located within the dummy region.

20. The package structure of claim 18, wherein the second region and a portion of the first region overlapped with the dummy region is free of the first contact pad,
wherein the package structure further comprises:
a second redistribution circuit structure, disposed on the insulating encapsulation and electrically coupled to the semiconductor die; and
a plurality of conductive pillars, disposed between the first redistribution circuit structure and the second redistribution circuit structure and propping against the first redistribution circuit structure and the second redistribution circuit structure.

* * * * *